(12) United States Patent
Yamane et al.

(10) Patent No.: US 10,447,240 B2
(45) Date of Patent: Oct. 15, 2019

(54) ELASTIC WAVE DEVICE AND FILTER DEVICE

(71) Applicant: Murata Manufacturing Co., Ltd., Nagaokakyo-shi, Kyoto-fu (JP)

(72) Inventors: Takashi Yamane, Nagaokakyo (JP); Hideki Iwamoto, Nagaokakyo (JP); Keiji Okada, Nagaokakyo (JP); Syunsuke Kido, Nagaokakyo (JP); Masanori Otagawa, Nagaokakyo (JP); Ippei Hatsuda, Nagaokakyo (JP); Korekiyo Ito, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 510 days.

(21) Appl. No.: 15/186,619

(22) Filed: Jun. 20, 2016

(65) Prior Publication Data

US 2016/0294361 A1 Oct. 6, 2016

Related U.S. Application Data

(63) Continuation of application No. PCT/JP2014/083725, filed on Dec. 19, 2014.

(30) Foreign Application Priority Data

Dec. 26, 2013 (JP) .................... 2013-269249

(51) Int. Cl.
*H03H 9/64* (2006.01)
*H03H 9/02* (2006.01)
(Continued)

(52) U.S. Cl.
CPC ......... *H03H 9/6496* (2013.01); *H01L 41/047* (2013.01); *H01L 41/0477* (2013.01);
(Continued)

(58) Field of Classification Search
CPC ............. H03H 9/6496; H03H 9/14594; H03H 9/14576; H01L 41/047; H01L 41/0477; H01L 41/18
See application file for complete search history.

(56) References Cited

U.S. PATENT DOCUMENTS

2007/0296528 A1* 12/2007 Kando ................ H03H 9/0071
333/195
2010/0176900 A1 7/2010 Tanaka
(Continued)

FOREIGN PATENT DOCUMENTS

JP 2-45847 B2 10/1990
JP 2000-286663 A 10/2000
(Continued)

OTHER PUBLICATIONS

Official Communication issued in International Application PCT/JP2014/083725, dated Feb. 10, 2015.

*Primary Examiner* — Bryan P Gordon
(74) *Attorney, Agent, or Firm* — Keating & Bennett, LLP

(57) ABSTRACT

An elastic wave device includes IDT electrodes stacked on a piezoelectric thin film. The IDT electrode includes a plurality of first electrode fingers and a plurality of second electrode fingers. A line connecting the distal ends of the first electrode fingers or the distal ends of the second electrode fingers extends obliquely with respect to a propagation direction of an elastic wave at an oblique angle v. The oblique angle v is about 0.4° or more and about 10° or less.

24 Claims, 30 Drawing Sheets

(51) Int. Cl.
  *H03H 9/145* (2006.01)
  *H01L 41/047* (2006.01)
  *H01L 41/08* (2006.01)
  *H01L 41/18* (2006.01)

(52) U.S. Cl.
  CPC ............ *H01L 41/081* (2013.01); *H01L 41/18* (2013.01); *H03H 9/02574* (2013.01); *H03H 9/14532* (2013.01); *H03H 9/14576* (2013.01); *H03H 9/14579* (2013.01); *H03H 9/14594* (2013.01)

(56) References Cited

U.S. PATENT DOCUMENTS

| | | | |
|---|---|---|---|
| 2010/0244626 A1* | 9/2010 | Yamanaka | H03H 9/02551 310/313 B |
| 2011/0215883 A1* | 9/2011 | Fujiwara | H03H 9/64 333/195 |
| 2011/0241148 A1* | 10/2011 | Hiyama | H01L 27/14623 257/435 |
| 2012/0062069 A1* | 3/2012 | Yamanaka | H03H 9/02551 310/313 A |
| 2013/0099875 A1 | 4/2013 | Shimizu et al. | |
| 2013/0249647 A1* | 9/2013 | Nakanishi | H03H 9/02559 333/186 |
| 2013/0285768 A1 | 10/2013 | Watanabe et al. | |
| 2014/0001919 A1* | 1/2014 | Komatsu | H03H 9/02818 310/313 B |
| 2014/0145557 A1* | 5/2014 | Tanaka | H03H 9/059 310/313 D |
| 2015/0102705 A1* | 4/2015 | Iwamoto | H03H 9/0222 310/313 B |

FOREIGN PATENT DOCUMENTS

| | | |
|---|---|---|
| WO | 2006/109591 A1 | 10/2006 |
| WO | 2009/050932 A1 | 4/2009 |
| WO | 2012/086639 A1 | 6/2012 |
| WO | 2012/140831 A1 | 10/2012 |
| WO | 2013/002033 A1 | 1/2013 |

* cited by examiner

ELASTIC WAVE DEVICE AND FILTER DEVICE

CROSS REFERENCE TO RELATED APPLICATIONS

This application claims the benefit of priority to Japanese Patent Application 2013-269249 filed Dec. 26, 2013 and is a Continuation Application of PCT/JP2014/083725 filed on Dec. 19, 2014. The entire content of each application are hereby incorporated by reference.

BACKGROUND OF THE INVENTION

1. Field of the Invention

The present invention relates to an elastic wave device for use in a resonator, a band pass filter, or the like. More particularly, the present invention relates to an elastic wave device including a piezoelectric thin film made of $LiTaO_3$ and a filter device including the elastic wave device.

2. Description of the Related Art

WO12/086639 discloses an elastic wave device in which a high acoustic velocity film, a low acoustic velocity film, a $LiTaO_3$ film, and an IDT electrode are stacked on a support substrate in that order. According to WO12/086639, a leaky wave that propagates through the $LiTaO_3$ film is used.

Japanese Unexamined Patent Application Publication No. 2000-286663 discloses a surface acoustic wave resonator in which an electrode made of Al is provided on a 15°-rotated Y-cut X-propagation $LiNbO_3$ film. In this surface acoustic wave resonator, a straight line connecting distal ends of first electrode fingers of the IDT electrode and a straight line connecting distal ends of second electrode fingers of the IDT electrode extend obliquely with respect to a surface-acoustic-wave propagation direction at an angle of about 18° to 72°.

The elastic wave device described in WO12/086639 has a problem that the frequency characteristic thereof has transverse-mode ripples.

According to Japanese Unexamined Patent Application Publication No. 2000-286663, the transverse mode reflected by one busbar and that reflected by the other busbar cancel each other to reduce the transverse mode.

However, in the elastic wave device in which an elastic wave is confined by using a high acoustic velocity film as described in WO12/086639, when the upper and lower busbars extend obliquely with respect to the surface-acoustic-wave propagation direction at the same angle as described in Japanese Unexamined Patent Application Publication No. 2000-286663, the oblique angle is 18° or more and 72° or less, and is too large. Therefore, a large insertion loss occurs.

SUMMARY OF THE INVENTION

Preferred embodiments of the present invention provide an elastic wave device capable of effectively reducing transverse-mode ripples while preventing an increase in insertion loss.

Preferred embodiments of the present invention also provide a filter device including the elastic wave device.

According to a preferred embodiment of the present invention, an elastic wave device includes a piezoelectric film made of $LiTaO_3$, and an IDT electrode located on one surface of the piezoelectric film. The IDT electrode includes a plurality of first electrode fingers and a plurality of second electrode fingers that are alternately arranged. A thickness of the piezoelectric film made of $LiTaO_3$ is about 10λ or less when λ is a wavelength determined by a pitch of the electrode fingers of the IDT electrode. A direction of a line connecting distal ends of the plurality of first electrode fingers and a direction of a line connecting distal ends of the second electrode fingers are at an oblique angle ν with respect to a propagation direction ψ of an elastic wave excited by the IDT electrode, the propagation direction ψ being determined by Euler angles (φ, θ, ψ) of the $LiTaO_3$, and the oblique angle ν is in a range of about 0.4° or more and about 15° or less.

According to a preferred embodiment of the present invention, an elastic wave device includes a piezoelectric film made of $LiTaO_3$; a support substrate; a high acoustic velocity film that is located on the support substrate and in which an acoustic velocity of a bulk wave that propagates through the high acoustic velocity film is higher than an acoustic velocity of an elastic wave that propagates through the piezoelectric film; a low acoustic velocity film that is stacked on the high acoustic velocity film and in which an acoustic velocity of a bulk wave that propagates through the low acoustic velocity film is lower than an acoustic velocity of a bulk wave that propagates through the piezoelectric film; the piezoelectric film stacked on the low acoustic velocity film; and an IDT electrode located on one surface of the piezoelectric film. The IDT electrode includes a plurality of first electrode fingers and a plurality of second electrode fingers that are alternately arranged. A thickness of the piezoelectric film made of $LiTaO_3$ is about 10λ or less when λ is a wavelength determined by a pitch of the electrode fingers of the IDT electrode. A direction of a line connecting distal ends of the plurality of first electrode fingers and a direction of a line connecting distal ends of the second electrode fingers are at an oblique angle ν with respect to a propagation direction ψ of an elastic wave excited by the IDT electrode, the propagation direction ψ being determined by Euler angles (φ, θ, ψ) of the $LiTaO_3$, and the oblique angle ν is in a range of about 0.4° or more and about 15° or less.

According to a preferred embodiment of the present invention, an elastic wave device includes a piezoelectric film made of $LiTaO_3$; a high acoustic velocity support substrate in which an acoustic velocity of a bulk wave that propagates through the high acoustic velocity support substrate is higher than an acoustic velocity of an elastic wave that propagates through the piezoelectric film; a low acoustic velocity film that is stacked on the high acoustic velocity support substrate and in which an acoustic velocity of a bulk wave that propagates through the low acoustic velocity film is lower than an acoustic velocity of a bulk wave that propagates through the piezoelectric film; the piezoelectric film stacked on the low acoustic velocity film; and an IDT electrode located on one surface of the piezoelectric film. The IDT electrode includes a plurality of first electrode fingers and a plurality of second electrode fingers that are alternately arranged. A thickness of the piezoelectric film made of $LiTaO_3$ is about 10λ or less when λ is a wavelength determined by a pitch of the electrode fingers of the IDT electrode. A direction of a line connecting distal ends of the plurality of first electrode fingers and a direction of a line connecting distal ends of the second electrode fingers are at an oblique angle ν with respect to a propagation direction ψ of an elastic wave excited by the IDT electrode, the propagation direction ψ being determined by Euler angles (φ, θ, ψ) of the $LiTaO_3$, and the oblique angle ν is in a range of about 0.4° or more and about 15° or less.

According to various preferred embodiments of the present invention, preferably, the oblique angle v is preferably about 10° or less. In such a case, the insertion loss is reduced.

In an elastic wave device according to a preferred embodiment of the present invention, preferably, the thickness of the piezoelectric film made of LiTaO$_3$ is more than about 0.2λ when λ is the wavelength determined by the pitch of the electrode fingers of the IDT electrode.

In an elastic wave device according to a preferred embodiment of the present invention, preferably, an electrode-finger overlap width of the IDT electrode is more than about 10λ. In such a case, the transverse-mode ripples is more effectively reduced. Although the upper limit of the electrode-finger overlap width is not particularly limited, the electrode-finger overlap width is preferably about 50λ or less. In such a case, the resistance of the electrode fingers is reduced.

In an elastic wave device according to a preferred embodiment of the present invention, preferably, a cut angle of the LiTaO$_3$ is about 30° or more and about 60° or less. When the cut angle is about 60° or less, transverse mode spurious is more effectively reduced. When the cut angle is about 30° or more, the difference between the TCF at the resonant frequency and the TCF at the anti-resonant frequency is reduced.

In an elastic wave device according to a preferred embodiment of the present invention, preferably, a duty of the IDT electrode is about 0.3/λ or more and less than about 0.7. In such a case, the transverse-mode ripples are more effectively reduced.

In an elastic wave device according to a preferred embodiment of the present invention, preferably, first dummy electrode fingers oppose the distal ends of the first electrode fingers of the IDT electrode with gaps therebetween, and second dummy electrode fingers oppose the distal ends of the second electrode fingers of the IDT electrode with gaps therebetween, the first dummy electrode fingers being connected to a second busbar, the second dummy electrode fingers being connected to a first busbar. When a distance from the distal ends of the first and second electrode fingers to proximal ends of the second and first dummy electrode fingers is an offset length L, and a size of the gaps in a direction in which the electrode fingers extend is G, (L−G)≥7.5×λ×tan(v) is satisfied. In such a case, the insertion loss is reduced. More preferably, (L−G)≥11.5×λ×tan(v) is satisfied; still more preferably, (L−G)≥17.5×λ×tan(v) is satisfied.

In an elastic wave device according to a preferred embodiment of the present invention, the size G of the gaps is preferably more than about 0.1 μm and less than about 0.25λ.

In an elastic wave device according to a preferred embodiment of the present invention, preferably, either or both of the first electrode fingers and the second electrode fingers of the IDT electrode are provided with projecting portion that project outward in a width direction of the electrode fingers from side edges that extend in a direction in which the electrode fingers extend. In such a case, the ripples are more effectively reduced.

The projecting portions may be provided on side edge portions of the either or both of the first and second electrode fingers, the side edge portions being continuous to the distal ends of the either or both of the first and second electrode fingers. Alternatively, either or both of the first and second dummy electrodes may be provided with the projecting portions. The projecting portions may be provided on the side edges of the electrode fingers that do not extend to the distal ends of the first and second electrode fingers.

In various preferred embodiments of the present invention, preferably, the projecting portions preferably have a trapezoidal shape in plan view, and when a length of a bottom side of the trapezoidal shape that is continuous to the corresponding side edge is TW1, TW1≥0.11735λ is satisfied.

In an elastic wave device according to a preferred embodiment of the present invention, preferably, when a minimum dimension of the projecting portions in a direction along the side edges of the electrode fingers is TW2, TW2≥0.02915λ is satisfied.

In an elastic wave device according to a preferred embodiment of the present invention, preferably, wherein a dimension of the projecting portions in the propagation direction of the elastic wave is TH, TH 0.0466λ is satisfied.

In an elastic wave device according to a preferred embodiment of the present invention, preferably, the IDT electrode is made of Al or an alloy containing Al as a main component. In this case, the film thickness of the IDT electrode is in the range of about 0.08λ or more and about 0.097λ or less. In such a case, the filter characteristics are improved and the transverse-mode ripples are more effectively reduced. More preferably, the film thickness of the IDT electrode is about 0.10λ or more and about 400 nm or less.

A filter device according to various preferred embodiments of the present invention includes at least one or more elastic wave devices, each being one of the above-described elastic wave devices.

Another filter device according to various preferred embodiments of the present invention includes a plurality of ±v elastic wave devices, each being one of the above-described elastic wave devices.

Another filter device according to various preferred embodiments of the present invention includes a plurality of elastic wave devices, each being one of the above-described elastic wave devices.

The elastic wave device according to various preferred embodiments of the present invention may be a band pass filter. A duplexer according to various preferred embodiments of the present invention includes a band pass filter including the elastic wave device according to one of the various preferred embodiments of the present invention.

According to various preferred embodiments of the present invention, the transverse-mode ripples are effectively reduced. Therefore, an elastic wave device having favorable resonance characteristics or filter characteristics is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described with reference to the drawings to clarify the present invention.

Figure 1:
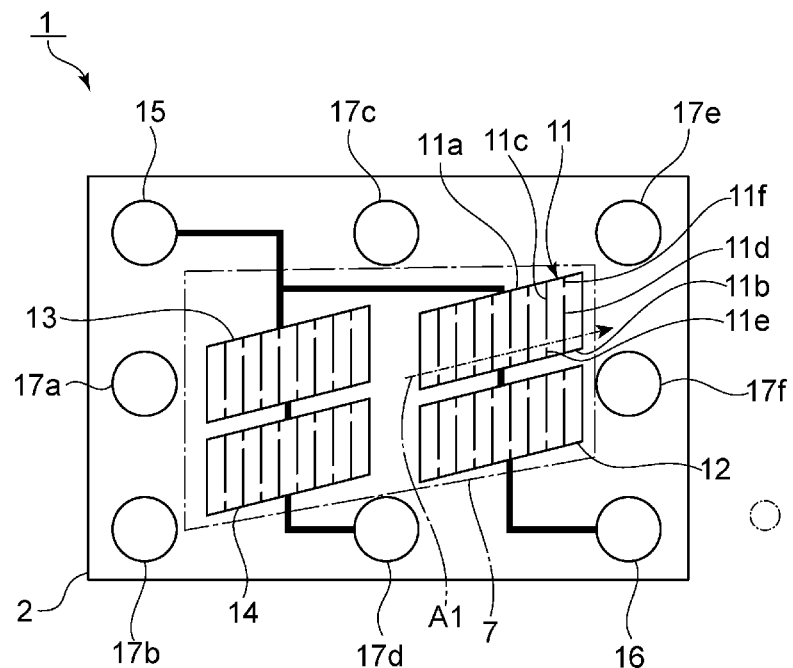
FIG. 1 is a schematic plan view of an elastic wave device according to a first preferred embodiment of the present invention.
Figure 2:
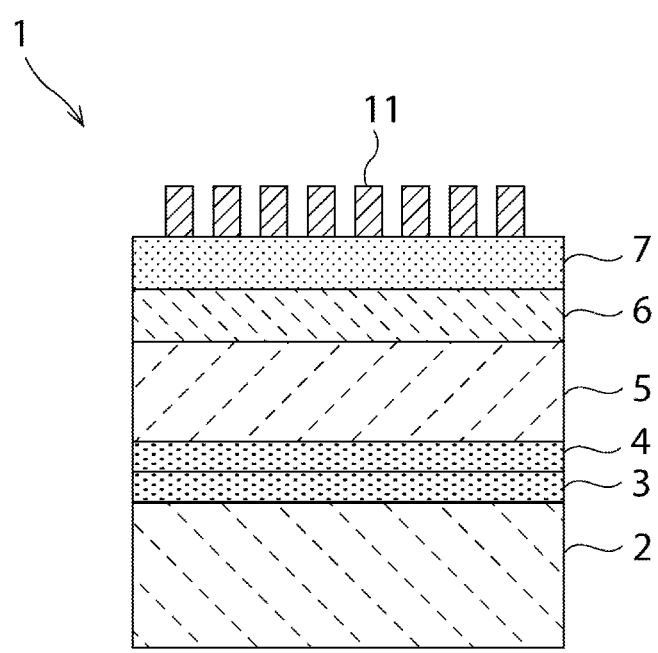
FIG. 2 is a schematic front sectional view of the elastic wave device according to the first preferred embodiment of the present invention.

FIG. 1 is a schematic plan view of an elastic wave device according to a first preferred embodiment of the present invention, and FIG. 2 is a front sectional view illustrating the structure of the main portion of the elastic wave device.

As illustrated in FIG. 2, an elastic wave device 1 includes a support substrate 2. Bonding material layers 3 and 4 are stacked on the support substrate 2. A high acoustic velocity film 5 is stacked on the bonding material layers 3 and 4. A low acoustic velocity film 6 is stacked on the high acoustic velocity film 5. A piezoelectric film 7 made of LiTaO$_3$ is stacked on the low acoustic velocity film 6. An IDT electrode 11 is provided on the piezoelectric film 7. In the present preferred embodiment, the support substrate 2 is made of silicon. The material of the support substrate 2 is not particularly limited. A semiconductor material other than silicon may be used. Alternatively, an insulating material, such as glass or an insulating ceramic, may be used.

The material of the support substrate 2 is preferably silicon as in the present preferred embodiment. In particular, the material preferably has a resistivity of about 100 Ωcm or more, more preferably about 1000 Ωcm or more, and still more preferably about 4000 Ωcm or more. When the resistivity is high, the capacitive coupling between the support substrate 2 and an electrode, which will be described below, is able to be effectively suppressed. Accordingly, the insertion loss is able to be further reduced.

Moreover, silicon has a small coefficient of thermal expansion. Therefore, expansion and contraction of a functional film or the like provided on the support substrate 2 due to a temperature change is reduced. Accordingly, frequency variation of the thermal load is reduced, and the temperature characteristics is able to be further improved. Also, since silicon has a high thermal conductivity, heat generated by the elastic wave device is able to be efficiently dissipated. Thus, the electric power handling capability is able to be improved.

Furthermore, the support substrate 2 made of silicon is easy to process, and therefore is able to be easily manufactured. The support substrate 2 is also able to be easily diced. Since the flexural strength is high, the thickness of the elastic wave device is reduced.

In the present preferred embodiment, the bonding material layers 3 and 4 are made of silicon oxide. A bonding material other than silicon oxide may instead be used. The material of the bonding material layers 3 and 4 is not particularly limited as long as the high acoustic velocity film can be bonded to the support substrate 2. In the present preferred embodiment, the high acoustic velocity film 5 is made of aluminum nitride. The high acoustic velocity film 5 may be made of any appropriate material as long as the acoustic velocity of a bulk wave that propagates through the high acoustic velocity film 5 is higher than that of an elastic wave that propagates through the piezoelectric film 7.

In the present preferred embodiment, the low acoustic velocity film 6 is made of silicon oxide. The low acoustic velocity film 6 may be made of any appropriate material as long as the acoustic velocity of the bulk wave that propagates through the low acoustic velocity film 6 is lower than that of the bulk wave that propagates through the piezoelectric film 7.

In the present preferred embodiment, the high acoustic velocity film 5 is stacked on the lower side of the low acoustic velocity film 6. Therefore, the energy of the elastic wave is able to be confined within a region extending to the high acoustic velocity film 5.

In the present preferred embodiment, the IDT electrode 11 includes an Al film. Alternatively, the IDT electrode 11 may include an alloy film including an Al film as a main component instead of the Al film. The IDT electrode 11 may instead include various metal materials other than Al or an alloy containing Al as a main component. Examples of the metal materials include Cu, Mo, W, Ag, Pd, and an alloy thereof.

As illustrated in FIG. 1, in the elastic wave device 1, an input terminal 15, an output terminal 16, and ground terminals 17a to 17f are provided on the support substrate 2. The IDT electrode 11 and an IDT electrode 12 are connected in series by a conductive path that connects the input terminal 15 and the output terminal 16. The IDT electrodes 11 and 12 define series-arm resonators on a series arm that connects the input terminal 15 and the output terminal 16 to each other.

IDT electrodes 13 and 14 are connected in series by a conductive path that connects the input terminal 15 and the ground terminal 17d. The IDT electrodes 13 and 14 define parallel-arm resonators provided on a parallel arm. Thus, the elastic wave device 1 is a ladder filter including two series-arm resonators and two parallel-arm resonators.

The input terminal 15, the output terminal 16, and the ground terminals 17a to 17f are provided in a region outside the region in which the piezoelectric film 7 is provided.

The oblique angle v, which will be described below, of the IDT electrodes 11 to 14 is preferably in the range of about 0.4° or more and about 15° or less. Accordingly, transverse-mode ripples are effectively reduced.

As described above, the elastic wave device 1 including the high acoustic velocity film 5 and the low acoustic velocity film 6 tends to have a frequency characteristic including ripples due to the transverse mode. As described in Japanese Unexamined Patent Application Publication No. 2000-286663, when a LiNbO$_3$ substrate is used, a significant amount of transverse-mode ripples are generated and affect other characteristics. The problem of the transverse-mode ripples does not occur when a LiTaO$_3$ substrate is used. However, it has been discovered that, in the basic structure of a preferred embodiment of the present invention, which includes the LiTaO$_3$ film, the low acoustic velocity film, the high acoustic velocity film, and the support substrate structure, a large amount of transverse-mode ripples are generated even though LiTaO$_3$ is used. The amount of transverse-mode ripples increases when, in particular, the thickness of the LiTaO$_3$ film is about 10λ or less. In the present preferred embodiment, since the oblique angle ν is within the above-described specific range, the transverse-mode ripples are effectively reduced. This will be described in more detail.

The oblique angle ν of the IDT electrode 11 will be described as a representative. As illustrated in FIG. 1, the IDT electrode 11 includes a first busbar 11a that extends obliquely with respect to a surface-acoustic-wave propagation direction. A second busbar 11b is separated from the first busbar 11a. The second busbar 11b also extends obliquely with respect to the elastic-wave propagation direction at the same angle as the first busbar 11a. The first busbar 11a and the second busbar 11b extend parallel or substantially parallel to each other.

The first busbar 11a is connected to one end of each of a plurality of first electrode fingers 11c. The first electrode fingers 11c extend toward the second busbar 11b. The direction orthogonal to the first electrode fingers 11c is the surface-acoustic-wave propagation direction ψ. A plurality of second electrode fingers 11d are provided such that the first electrode fingers 11c and the second electrode fingers 11d are alternately arranged. One end of each of the second electrode fingers 11d is connected to the second busbar 11b.

First dummy electrode fingers 11e oppose the distal ends of the first electrode fingers 11c with gaps therebetween. The first dummy electrode fingers 11e are connected to the second busbar 11b. Similarly, second dummy electrode fingers 11f oppose the distal ends of the second electrode fingers 11d with gaps therebetween. The second dummy electrode fingers 11f are connected to the first busbar 11a.

In the IDT electrode 11, an imaginary line Al connecting the distal ends of the first electrode fingers 11c is at an angle of ν with respect to the elastic-wave propagation direction ψ. The direction of the imaginary line A1 connecting the distal ends of the first electrode fingers 11c is the same as the direction of the line connecting the distal ends of the second electrode fingers 11d.

Figure 3:
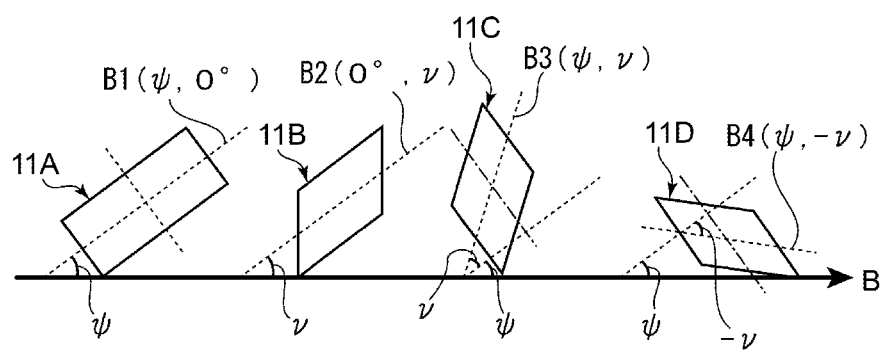
FIG. 3 is a schematic diagram illustrating an oblique angle v.

FIG. 3 is a schematic diagram illustrating the relationship between the propagation direction ψ and the oblique angle ν. The Euler angles of LiTaO$_3$ are defined as (φ, θ, ψ). The direction indicated by arrow B in FIG. 3 is the direction in which ψ=0°. The broken lines B1 to B4 on IDT electrodes 11A to 11D extend in directions parallel or substantially parallel to lines connecting the distal ends of the first electrode fingers of the IDT electrodes 11A to 11D. In the IDT electrode 11A, the direction B1 is the same as the propagation direction ψ in which the elastic wave propagates. Therefore, in this case, the direction B1 can be expressed as (ψ, 0°) in terms of (elastic-wave propagation direction, oblique angle ν relative to propagation direction). The direction can be expressed as (0°, ν) for the IDT electrode 11B, (ψ, ν) for the IDT electrode 11C, and (ψ, −ν) for the IDT electrode 11D.

In this specification, the angle between the propagation direction ψ and the direction of the line connecting the distal ends of the first electrode fingers 11c of the IDT electrode with respect to the propagation direction is defined as the oblique angle ν.

The characteristics of an elastic wave resonator including a single IDT electrode 11 in the above-described elastic wave device 1 will now be described.

The design parameters of the elastic wave resonator are as follows.

Piezoelectric thin film: Y-cut LiTaO$_3$ film with a cut angle of 55°
Electrode-finger overlap width of IDT electrode=15λ
Number of pairs of electrode fingers=83
λ=2 μm.
Offset length L described below=2λ
Duty of IDT electrode=0.6
Film thickness of IDT electrode=0.08λ
Thickness of LiTaO$_3$ film=0.3λ
Thickness of silicon oxide films forming bonding material layers=0.35λ
Gap size G=0.5 μm An elastic wave resonator of Comparative Example 1 having the above design parameters and an oblique angle ν of 0° was manufactured.

Figure 4:
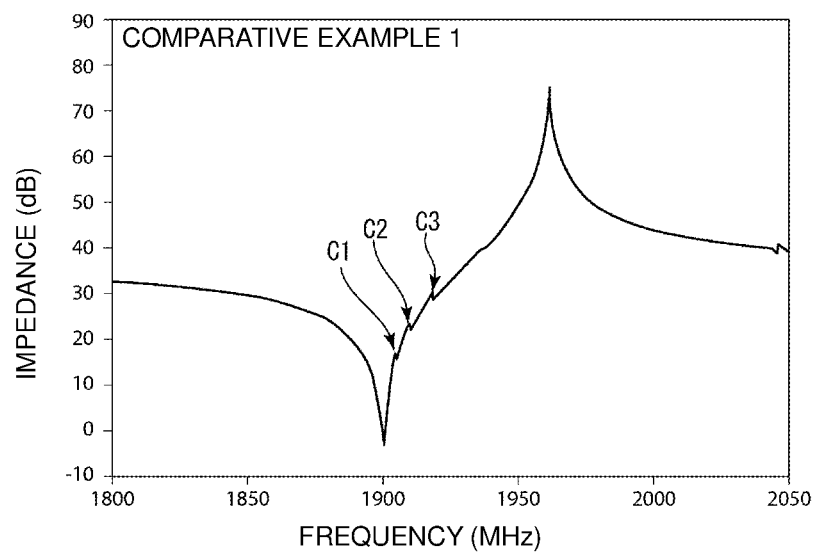
FIG. 4 shows the impedance characteristic of an elastic wave device according to Comparative Example 1 in which the oblique angle ν is 0°.
Figure 6:
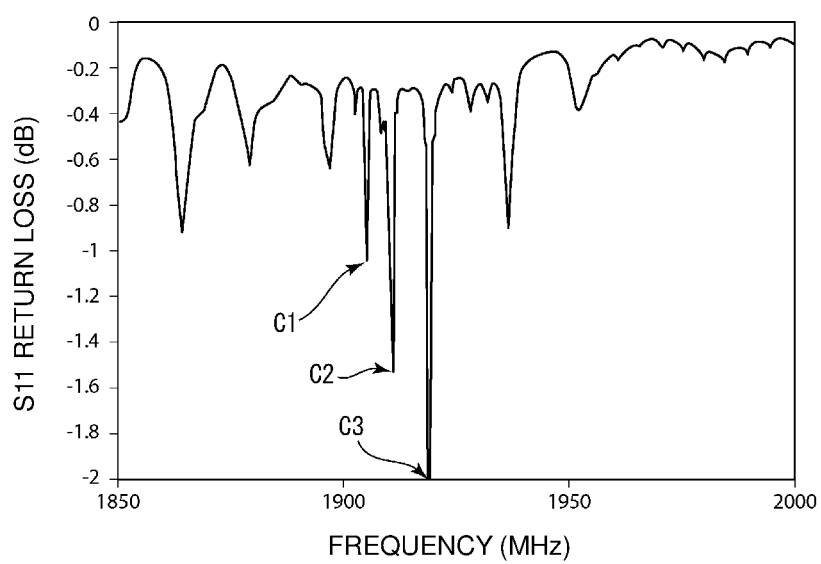
FIG. 6 shows the return loss characteristic of the elastic wave device according to Comparative Example 1 in which the oblique angle ν is 0°.

FIG. 4 shows the impedance characteristic of the elastic wave resonator prepared for comparison. FIG. 6 shows the return loss characteristic of the elastic wave resonator according to Comparative Example 1. In the elastic wave resonator of Comparative Example 1, the oblique angle ν is 0°. In other words, the propagation direction ψ is the same as the surface-acoustic-wave propagation direction.

Elastic wave resonators were manufactured similarly to Comparative Example 1 except that the oblique angle ν of the IDT electrode was set to 2.5°, 5.0°, 7.5°, 10°, and 15°.

Figure 5:
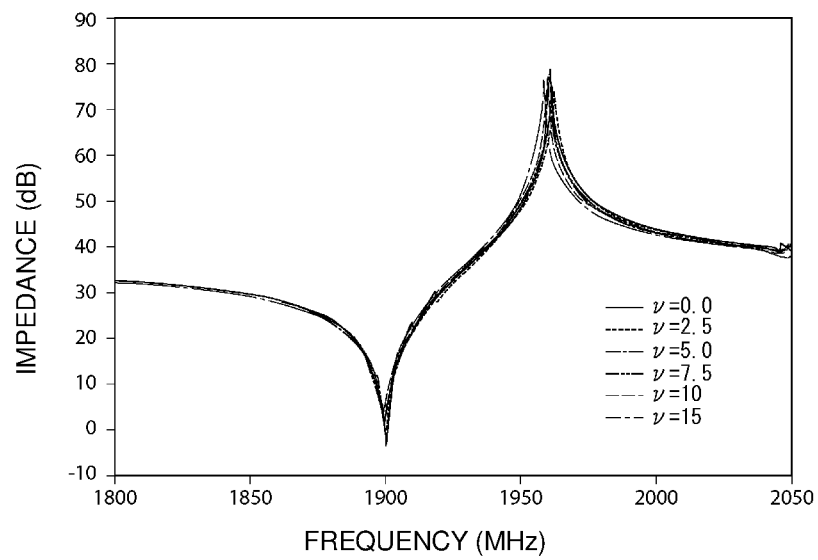
FIG. 5 shows changes in the impedance characteristic in the case where the oblique angle ν is changed.

FIG. 5 shows the impedance characteristics of these elastic wave resonators.

Figure 7:
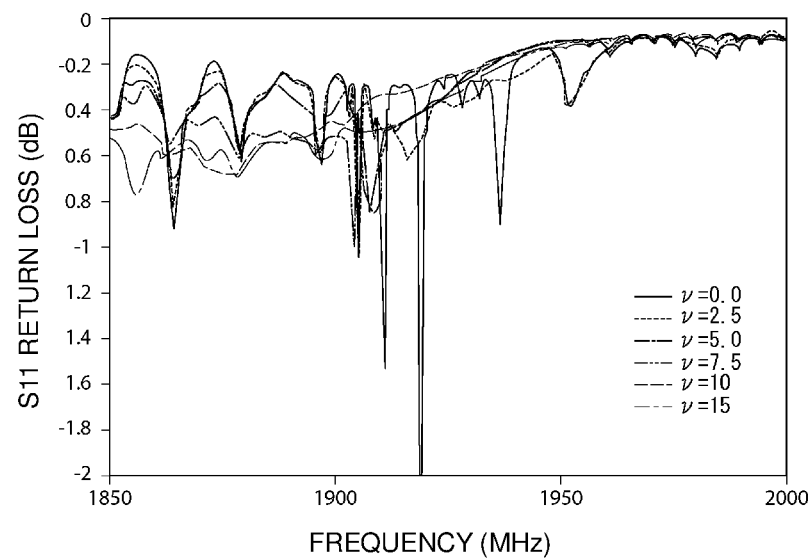
FIG. 7 shows changes in the return loss characteristic in the case where the oblique angle ν is changed.

FIG. 7 shows the return loss characteristics of the elastic wave resonators in which ν was 0.0°, about 2.5°, about 5.0°, about 7.5°, about 10°, and about 15° as described above.

Figure 8:
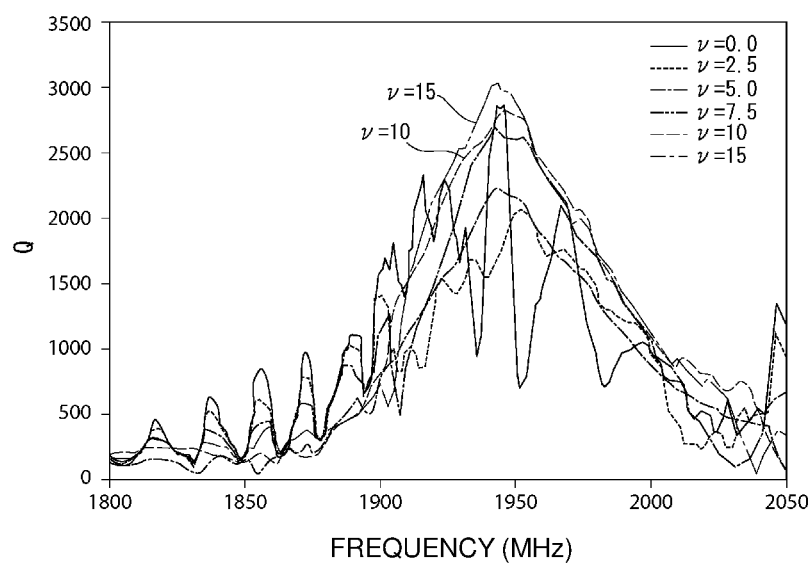
FIG. 8 shows changes in the Q value in the case where the oblique angle ν is changed.

FIG. 8 shows the relationships between the frequency and the Q value of the elastic wave resonators in which the oblique angle ν was 0°, about 2.5°, about 5.0°, about 7.5°, about 10°, and about 15°.

As is clear from FIG. 4, in Comparative Example 1, in which the oblique angle ν was 0°, ripples indicated by arrows C1 to C3 are present between the resonant frequency and the anti-resonant frequency. In FIG. 6, the ripples indicated by arrows C1 to C3 correspond to the ripples indicated by arrows C1 to C3 in FIG. 4.

Although it is not clear in FIG. 5, the return loss characteristics of FIG. 7 and the Q value-frequency characteristics of FIG. 8 show that the transverse-mode ripples are reduced when ν is about 2.5° or more.

As is clear from FIG. 7, when ν is about 2.5° or more, the transverse-mode ripples are effectively reduced from that in the case where ν is 0°.

Figure 9:
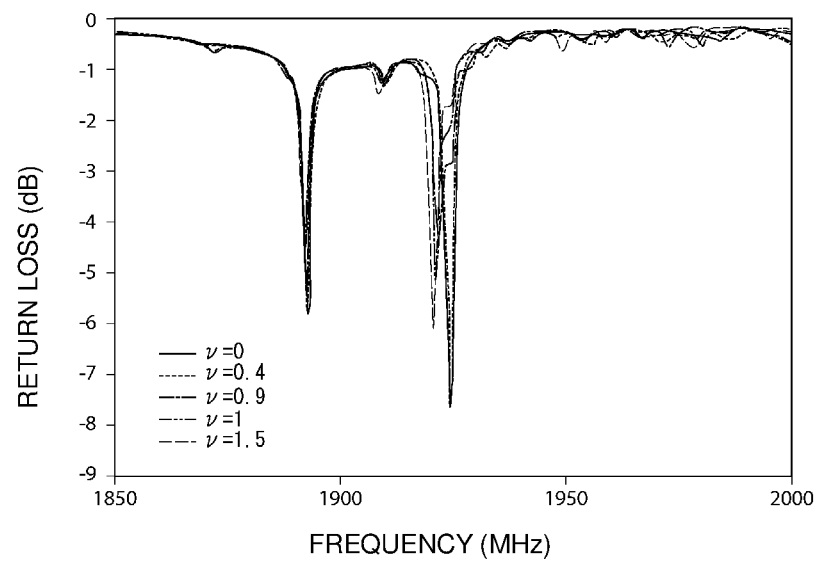
FIG. 9 shows changes in the return loss characteristic in the case where the oblique angle ν is changed.
Figure 10:
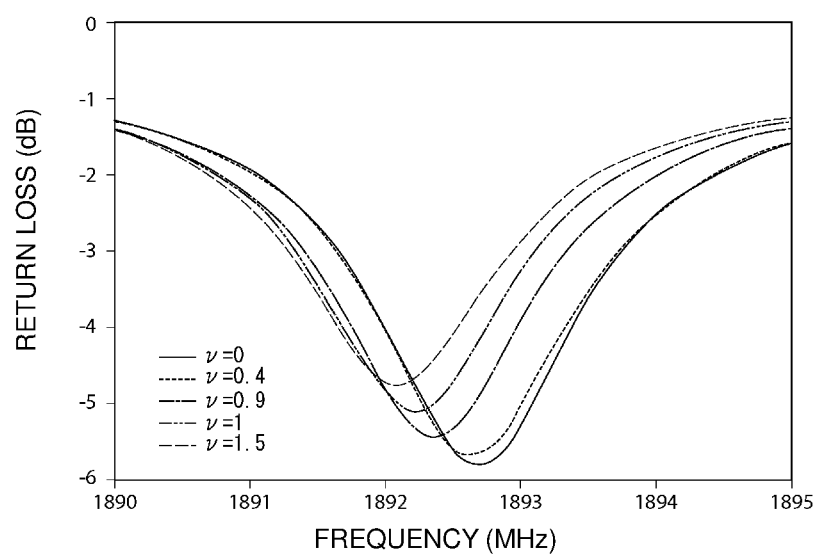
FIG. 10 is an enlarged view of FIG. 9, and shows changes in the return loss characteristic in the case where the oblique angle ν is changed.

Elastic wave resonators in which the oblique angle ν was set to 0°, about 0.4°, about 0.9°, about 1°, and about 1.5° were similarly manufactured. FIGS. 9 and 10 show the return loss characteristics of these elastic wave resonators. FIG. 10 is an enlarged view of FIG. 9.

As is clear from FIGS. 9 and 10, when the oblique angle ν is about 1° or more, the magnitude of the transverse-mode ripple is effectively reduced from those in the cases where the oblique angle ν is 0°, about 0.4°, and about 0.9°.

The transverse-mode ripples are reduced when the oblique angle ν is about 0.4° or more. In particular, as is clear from FIG. 7, the absolute value of the return loss is reduced to below 1 dB when ν is about 2.5° or more. Thus, the transverse-mode ripples are reduced when ν is about 0.4° or more, preferably about 2.5° or more.

FIG. 8 shows that ν is preferably about 10° or less to set the maximum value of the Q value to 3000 or less in order to reduce the loss. When the oblique angle ν is in the range of about 0.4° or more and about 10° or less, the transverse-mode ripples and the loss is reduced. Preferably, ν is in the range of about 2.5° or more and about 10° or less.

FIG. 8 shows that, to further reduce the loss, ν is preferably about 5° or more. Thus, more preferably, ν is in the range of about 5° or more and about 10° or less.

Also in piezoelectric resonator sections including the IDT electrode 12 and the IDT electrodes 13 and 14, the transverse-mode ripples are reduced by setting the oblique angle ν to about 0.4° or more.

Similar to FIG. 1, FIGS. 11 to 15, which will be described below, also schematically illustrates an electrode structure provided on a piezoelectric film and the positional relationship of the input and output terminals. Also in preferred embodiments illustrated in FIGS. 11 to 15, similar to the first preferred embodiment, bonding material layers, a high acoustic velocity film, a low acoustic velocity film, and the piezoelectric film are arranged in that order on the support substrate. The piezoelectric film is made of $LiTaO_3$ and has a thickness of about $10\lambda$ or less.

Figure 11:
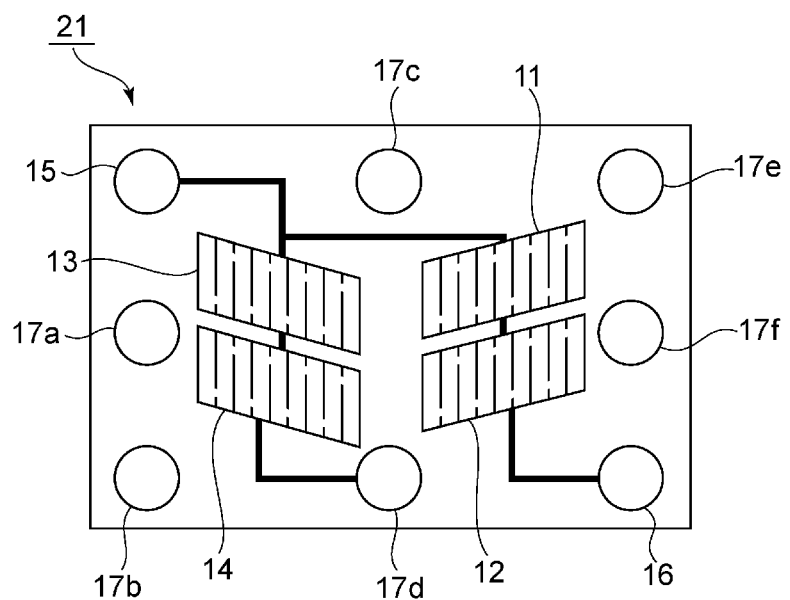
FIG. 11 is a schematic plan view of an elastic wave device according to a second preferred embodiment of the present invention.

FIG. 11 is a schematic plan view of an elastic wave device according to a second preferred embodiment of the present invention. In an elastic wave device 21 illustrated in FIG. 11, the structures of first and second IDT electrodes 11 and 12 are similar to those in the elastic wave device 1. Unlike the IDT electrodes 11 and 12, IDT electrodes 13 and 14 have a negative oblique angle ν. When the oblique angle of the IDT electrodes 11 and 12 is ν, the oblique angle of the IDT electrodes 13 and 14 is −ν. Thus, the IDT electrodes 11 to 14 may include an IDT electrode in which the sign of the oblique angle differs from that in the other IDT electrodes.

Figure 12:
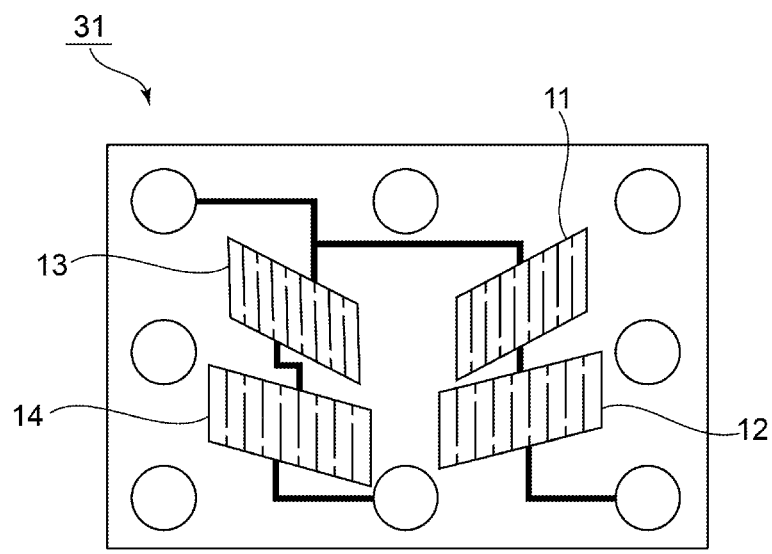
FIG. 12 is a schematic plan view of an elastic wave device according to a third preferred embodiment of the present invention.

FIG. 12 is a schematic plan view of an elastic wave device 31 according to a third preferred embodiment of the present invention. In the elastic wave device 31 according to the third preferred embodiment, the oblique angle of a first IDT electrode 11 is ν1, the oblique angle of a second IDT electrode 12 is ν2, and ν1>ν2 is satisfied. The oblique angle of a third IDT electrode 13 is −ν1, and the oblique angle of a fourth IDT electrode 14 is −ν2.

Thus, the IDT electrode 11 and the IDT electrode 12 may have different oblique angles. When the IDT electrodes 11 to 14 have different oblique angles as in the elastic wave devices 21 and 31, there is more freedom in the layout of the IDT electrodes. Also in these cases, when ν is in the above-described specific range, the transverse-mode ripples are effectively reduced as in the above-described preferred embodiment.

Figure 13:
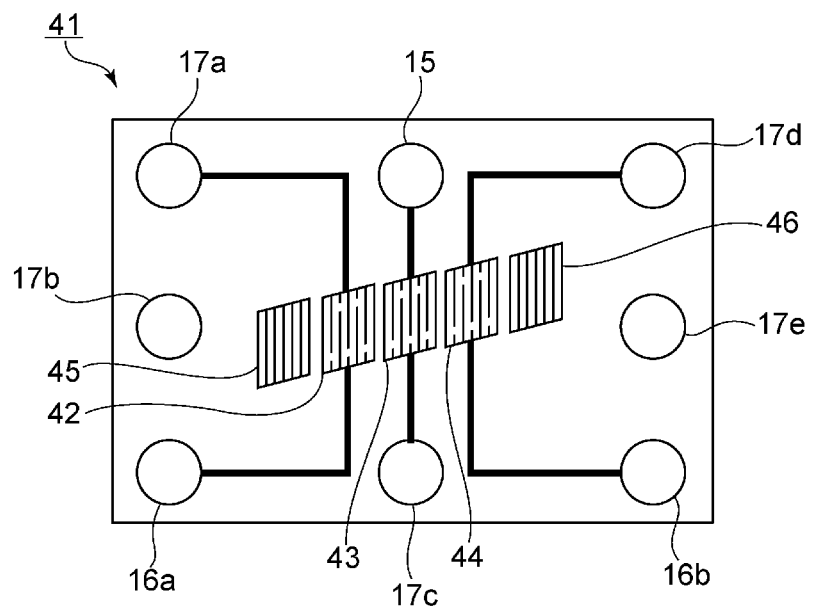
FIG. 13 is a schematic plan view of an elastic wave device according to a fourth preferred embodiment of the present invention.

FIG. 13 is a schematic plan view of an elastic wave device according to a fourth preferred embodiment of the present invention. In an elastic wave device 41, a 3-IDT longitudinally coupled resonator-type elastic wave filter section is located between an input terminal 15 and output terminals 16a and 16b. More specifically, IDT electrodes 42 to 44 are arranged next to each other in the elastic-wave propagation direction. Reflectors 45 and 46 are arranged on both sides of the IDT electrodes 42 to 44 in the surface-acoustic-wave propagation direction. Also in the present preferred embodiment, similar to the first preferred embodiment, each of the IDT electrodes 42 to 44 has an oblique angle ν of about 2.5° or more. Accordingly, the transverse-mode ripples are effectively reduced. Ground terminals 17a to 17e are provided on a piezoelectric film.

Figure 14:
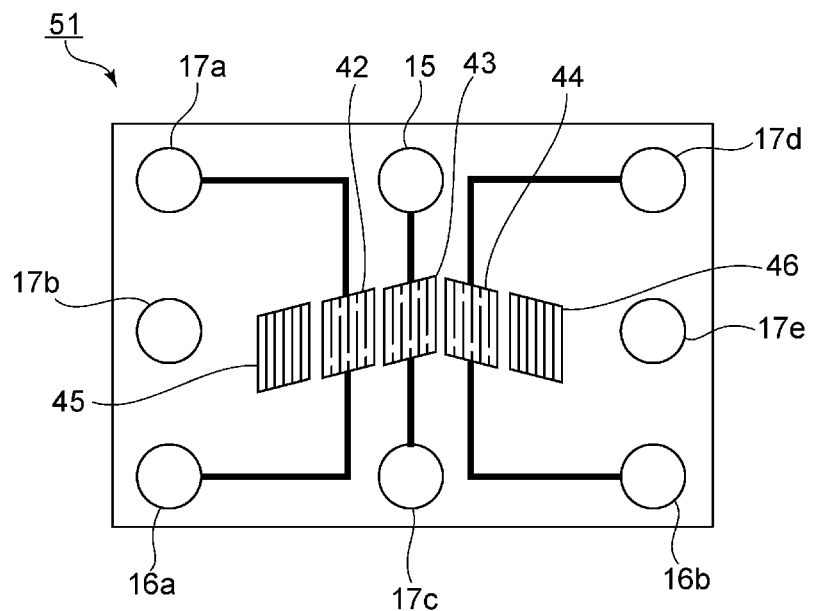
FIG. 14 is a schematic plan view of an elastic wave device according to a fifth preferred embodiment of the present invention.

FIG. 14 is a schematic plan view of an elastic wave device according to a fifth preferred embodiment of the present invention.

In an elastic wave device 51, similar to the elastic wave device 41, IDT electrodes 42 to 44 are arranged next to each other in the elastic-wave propagation direction. The IDT electrodes 42 and 43 have an oblique angle of ν4, and the IDT electrode 44 has an oblique angle of −ν4. Thus, among the IDT electrodes of a longitudinally coupled resonator-type surface acoustic wave filter, one IDT electrode may have an oblique angle different from that of the other IDT electrodes. In the present preferred embodiment, the IDT electrode 42 is connected to an output terminal 16a. The IDT electrode 44 is connected to an output terminal 16b. Accordingly, the IDT electrodes 42 to 44 are configured to have a balanced-unbalanced transforming function. As in the present preferred embodiment, the present invention may be applied to a balanced elastic wave filter.

Figure 15:
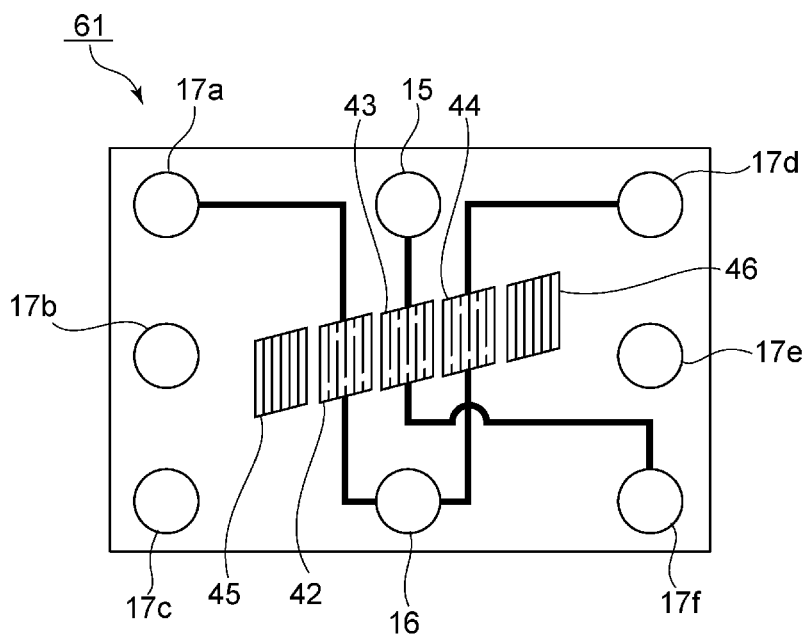
FIG. 15 is a schematic plan view of an elastic wave device according to a sixth preferred embodiment of the present invention.

FIG. 15 is a schematic plan view of an elastic wave device 61 according to a sixth preferred embodiment of the present invention. In the elastic wave device 61, one end of each of IDT electrodes 42 and 44 is connected to an output terminal 16. One end of an IDT electrode 43 is connected to an input terminal 15. Also in this structure, when the IDT electrodes 42 to 44 have an oblique angle of about 2.5° or more, the transverse-mode ripples are effectively reduced.

Elastic wave resonators similar to the elastic wave resonator of the example described in the first preferred embodiment were manufactured. The design parameters of the elastic wave resonators were as follows.

Piezoelectric thin film: Y-cut $LiTaO_3$ film with a cut angle of 60°

Electrode-finger overlap width of IDT electrode=$15\lambda$

Number of pairs of electrode fingers=166

$\lambda=2$ μm.

Offset length L described below=$2\lambda$

Duty of IDT electrode=0.6

Film thickness of IDT electrode=$0.08\lambda$

Thickness of silicon oxide films forming bonding material layers=$0.35\lambda$

Gap size G=0.5 μm

In the elastic wave resonators, the $LiTaO_3$ film thickness was set to about $0.2\lambda$, about $0.3\lambda$, and about $0.4\lambda$.

Among the elastic wave resonators having the above-described design parameters, the elastic wave resonator having a $LiTaO_3$ film thickness of about $0.2\lambda$ will be hereinafter referred to as Example 1.

Figure 16:
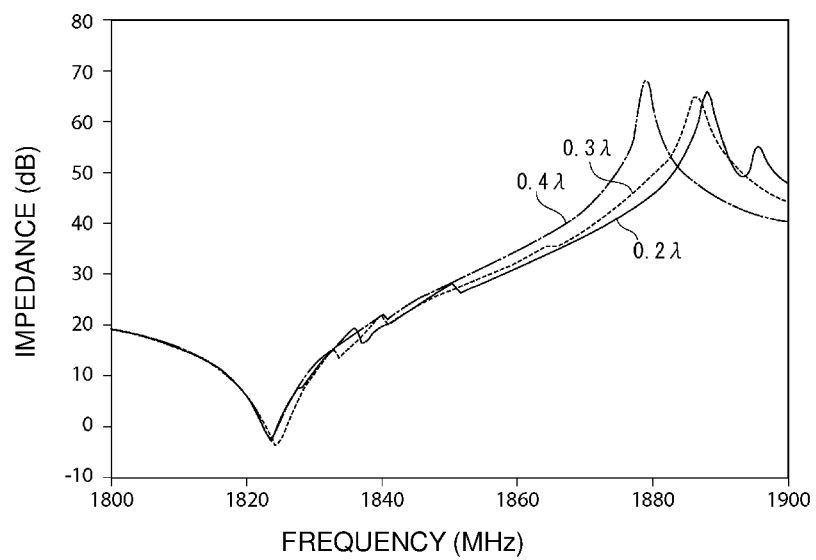
FIG. 16 shows changes in the impedance characteristic in the case where the $LiTaO_3$ film thickness is changed.
Figure 17:
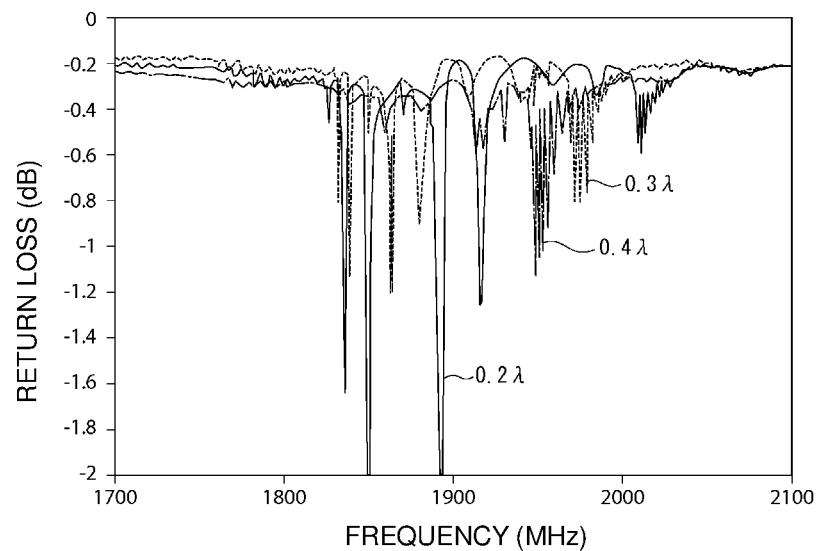
FIG. 17 shows changes in the return loss characteristic in the case where the $LiTaO_3$ film thickness is changed.

FIG. 16 shows changes in the impedance characteristic in the case where the thickness of the $LiTaO_3$ film is changed. FIG. 17 shows changes in the return loss characteristic.

As is clear from FIGS. 16 and 17, when the thickness of the $LiTaO_3$ film is more than $0.2\lambda$, the transverse-mode ripples are effectively reduced from those in the case where the thickness is about $0.2\lambda$.

The transverse-mode ripples are more effectively reduced when the thickness is about $0.4\lambda$ than when the thickness is about $0.3\lambda$. Therefore, the $LiTaO_3$ film thickness is preferably more than about $0.2\lambda$, more preferably, about $0.3\lambda$ or more, and still more preferably, about $0.4\lambda$ or more.

Figure 18:
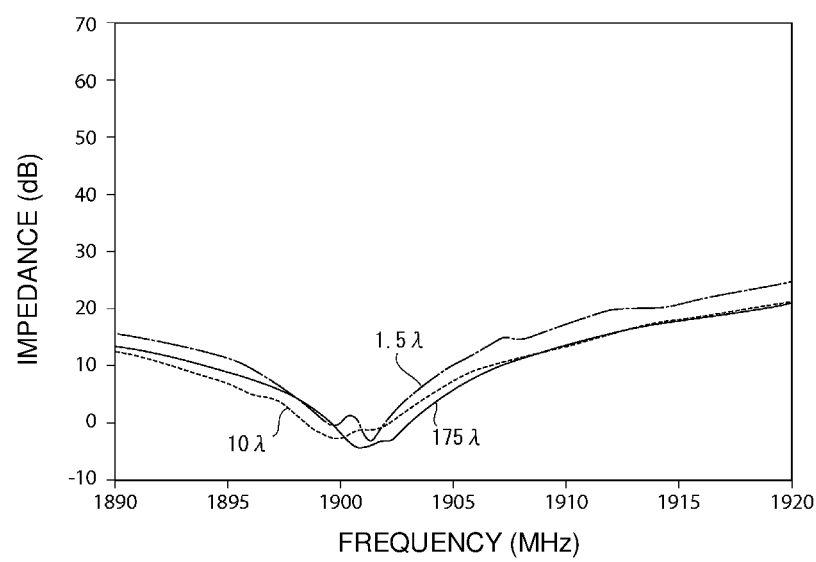
FIG. 18 shows changes in the impedance characteristic in the case where the $LiTaO_3$ film thickness is changed.
Figure 19:
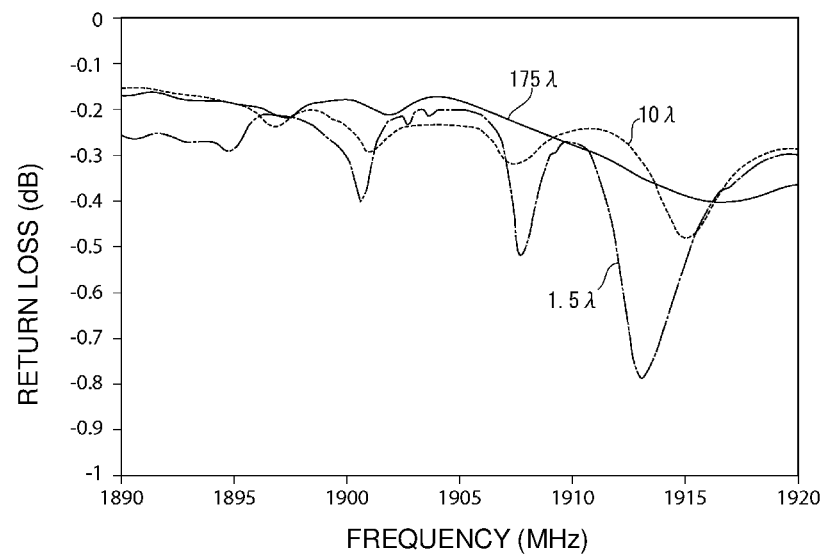
FIG. 19 shows changes in the return loss characteristic in the case where the $LiTaO_3$ film thickness is changed.

FIGS. 18 and 19 show the impedance characteristics and return loss characteristics, respectively, of elastic wave resonators prepared as reference examples. The oblique angle of the IDT electrode was set to ν=0°. The $LiTaO_3$ film thickness was set to about $1.5\lambda$, about $10\lambda$, and about $175\lambda$. Other parameters were similar to those of the elastic wave resonators of the above-described examples.

As is clear from FIGS. 18 and 19, when the LiTaO$_3$ film thickness is about 10λ or less, large transverse-mode ripples are generated.

However, in a preferred embodiment of the present invention, since the oblique angle ν is within the above-described specific range, as described above, the transverse-mode ripples are effectively reduced. When the LiTaO$_3$ film thickness is more than about 10λ, there is a risk that the energy concentration of the surface acoustic wave will be reduced and the characteristics will be degraded. Thus, according to a preferred embodiment of the present invention, the energy concentration of the surface acoustic wave is not reduced, and the influence of the transverse-mode ripples are reduced by setting the oblique angle ν to a specific value.

Figure 20:
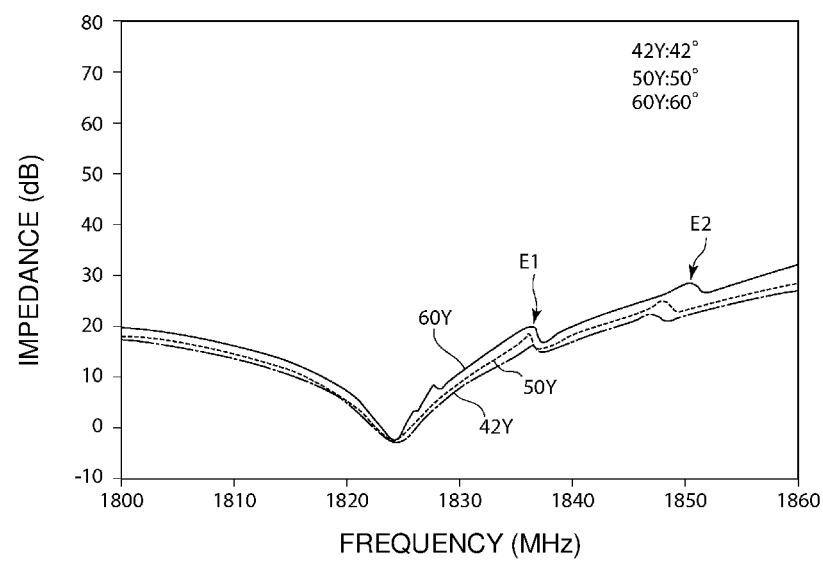
FIG. 20 shows changes in the impedance characteristic in the case where the cut angle of $LiTaO_3$ is changed.

In the elastic wave resonator having the above-described design parameters according to Example 1 described above, the cut angle of the LiTaO$_3$ film was changed to about 42°, about 50°, and about 60°. Thus, elastic wave resonators including LiTaO$_3$ films having different cut angles were prepared. FIG. 20 shows the impedance characteristics, and FIG. 21 shows the return loss characteristics.

Figure 21:
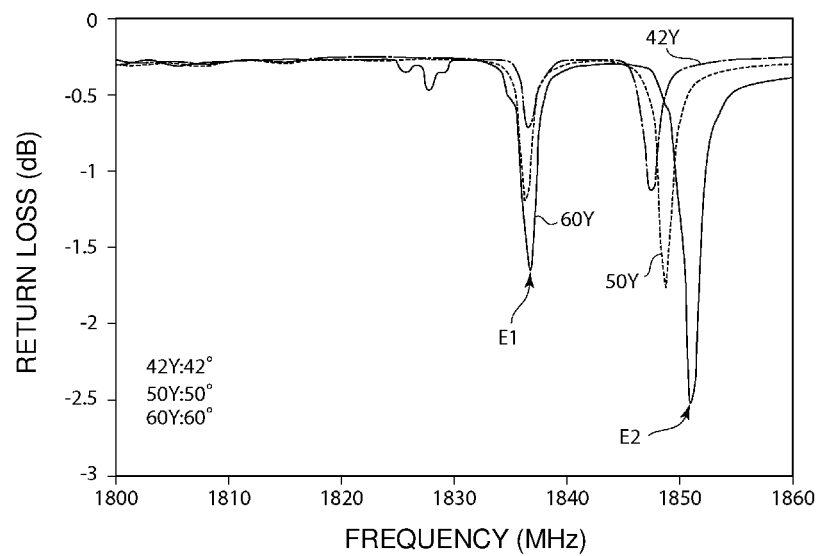
FIG. 21 shows changes in the return loss characteristic in the case where the cut angle of $LiTaO_3$ is changed.

As is clear from FIGS. 20 and 21, the transverse-mode ripples indicated by arrows E1 and E2 are smaller when the cut angle is about 50° Y-cut than when the cut angle is about 60° Y-cut. The transverse-mode ripples are further reduced in the case of about 42° Y-cut. Thus, the cut angle is preferably less than about 60°.

From the viewpoint of reducing the transverse-mode ripples, the lower limit of the cut angle is not particularly limited. However, when the cut angle is too small, the difference between the TCF at the resonant frequency and the TCF at the anti-resonant frequency increases. Therefore, preferably, the cut angle is about 30° or more Y-cut.

Figure 22:
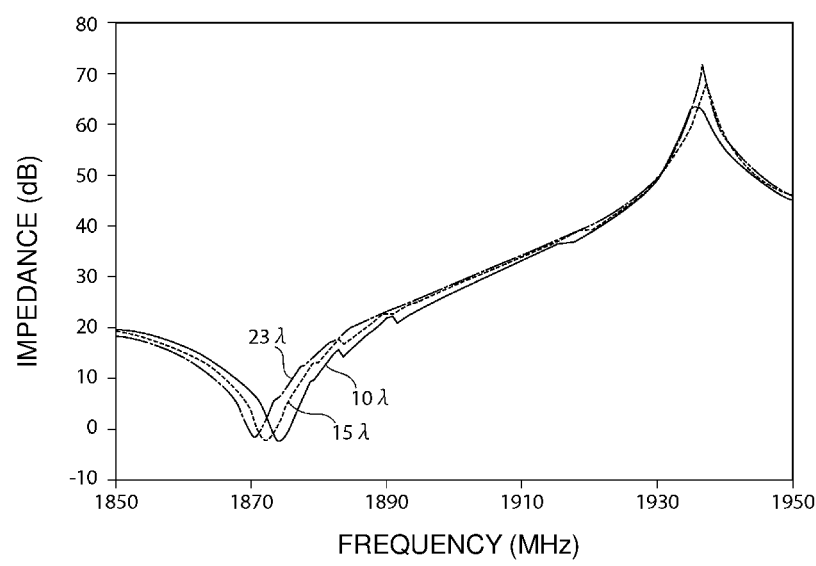
FIG. 22 shows changes in the impedance characteristic in the case where the overlap width of electrode fingers of IDT electrodes is changed.
Figure 23:
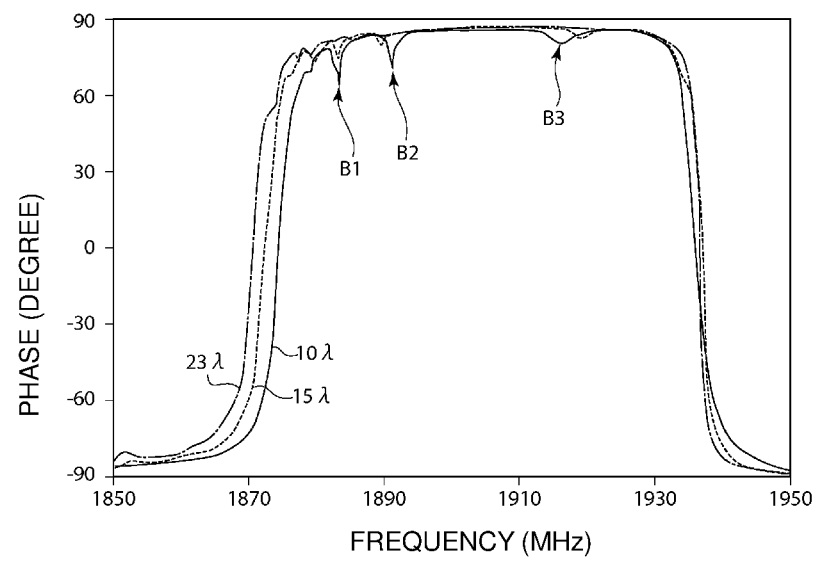
FIG. 23 shows changes in the phase characteristic in the case where the overlap width of the electrode fingers of the IDT electrodes is changed.
Figure 24:
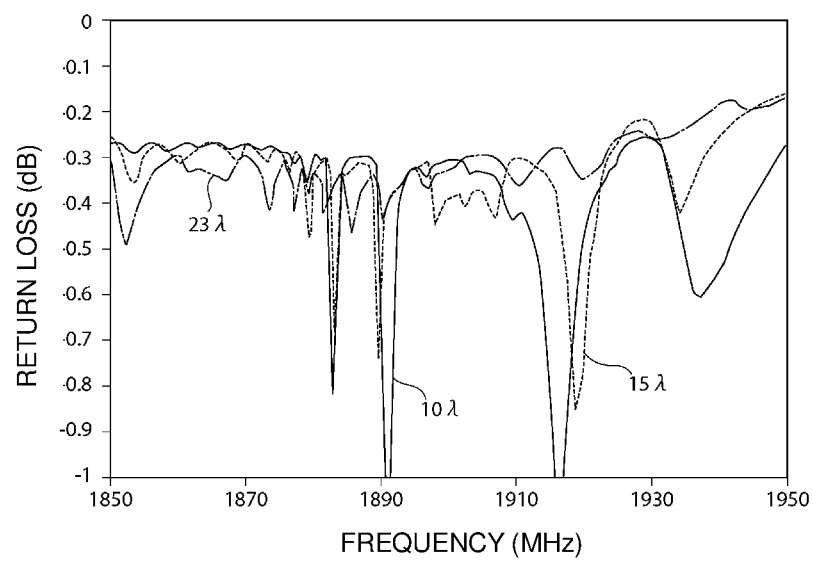
FIG. 24 shows changes in the return loss characteristic in the case where the overlap width of the electrode fingers of the IDT electrodes is changed.

Elastic wave resonators having a structure similar to that of Example 1 described above were manufactured. The cut angle of LiTaO$_3$ was set to about 65° Y-cut. The electrode-finger overlap width was changed to about 10λ, about 15λ, and about 23λ, and accordingly the number of pairs of the electrode fingers was set to 250, 166, and 108 to keep an impedance unchanged. FIG. 22 shows changes in the impedance characteristic in this case. FIG. 23 shows changes in the phase characteristic, and FIG. 24 shows changes in the return loss characteristic.

As is clear from FIG. 22, as the electrode-finger overlap width increases, the resonant frequency shifts toward the low-frequency side. As is clear from FIGS. 22 to 24, the transverse-mode ripples B1 to B3 is reduced by increasing the electrode-finger overlap width. In other words, as the electrode-finger overlap width increases to 15λ and 23λ from 10λ, the ripples indicated by arrows B1 to B3 in FIG. 23, for example, are reduced. Therefore, preferably, the electrode-finger overlap width of the IDT electrode is preferably more than about 10λ, and more preferably, about 15λ or more. The upper limit of the overlap width of the electrode fingers is not particularly limited from the viewpoint of reducing the transverse-mode ripples. However, when the overlap width of the electrode fingers is too large, the electrical resistance increases. Therefore, normally, the overlap width of the electrode fingers is preferably about 50λ or less. In such a case, the resistance is reduced.

Elastic wave resonators similar to the elastic wave resonator of Example 1 were manufactured. The design parameters were as follows.

Figure 25:
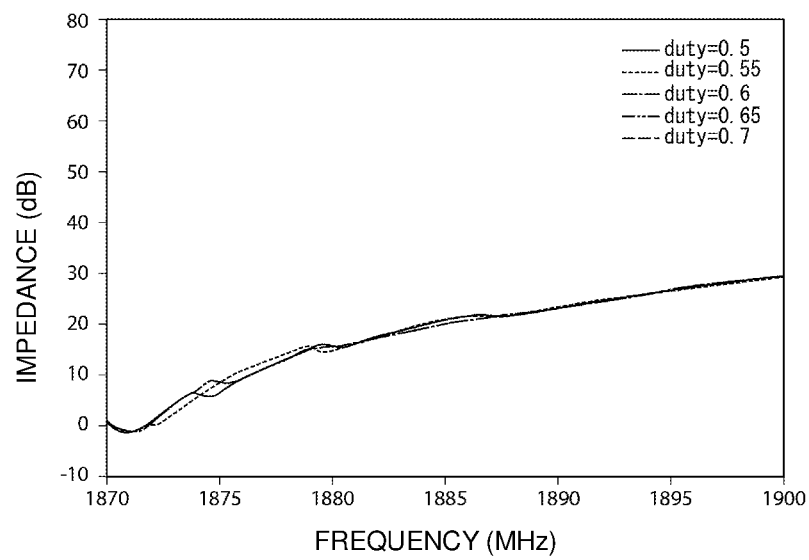
FIG. 25 shows changes in the impedance characteristic in the case where the duty of the IDT electrodes is changed.
Figure 26:
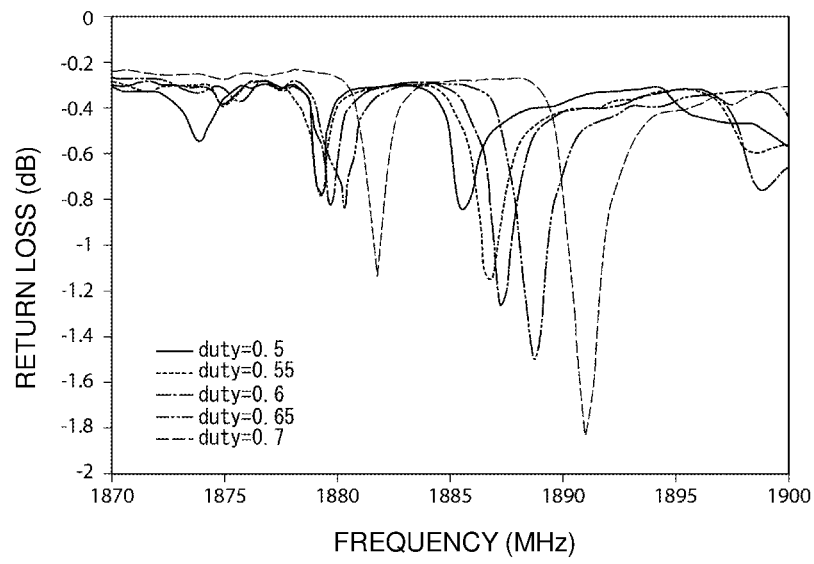
FIG. 26 shows changes in the return loss characteristic in the case where the duty of the IDT electrodes is changed.

Cut angle=60° Y-cut
Overlap width=11λ
Offset length L=2λ
Oblique angle ν=2.5°
Duty=0.5 to 0.7
Al film thickness=0.08λ
LT film thickness=0.3λ
Thickness of SiO$_2$ film below LT=0.35λ
λ=2 µm
Gap size G=0.5 µm The duty of the IDT electrode was changed to about 0.5, about 0.55, about 0.6, about 0.65, and about 0.7. FIGS. 25 and 26 show the impedance characteristics and return loss characteristics of these elastic wave resonators.

As is clear from FIGS. 25 and 26, as the duty decreases, the transverse-mode ripples are reduced. The duty is preferably less than about 0.7. In such a case, the transverse-mode ripples are effectively reduced from that in the case where the duty is about 0.7. More preferably, the duty is about 0.6 or less. In such a case, the transverse-mode ripples are more effectively reduced. Thus, the duty is preferably less than about 0.7, and more preferably, about 0.6 or less. The duty is equal to (2×dimension of the electrode fingers in the width direction)/λ. When the duty is too small, it becomes difficult to manufacture the IDT electrode. Therefore, instead of the duty, the dimension of the electrode fingers in the width direction is preferably set to about 0.15 µm or more. The width of the electrode fingers can be expressed by using the duty as about 0.3/λ or more.

Figure 27:
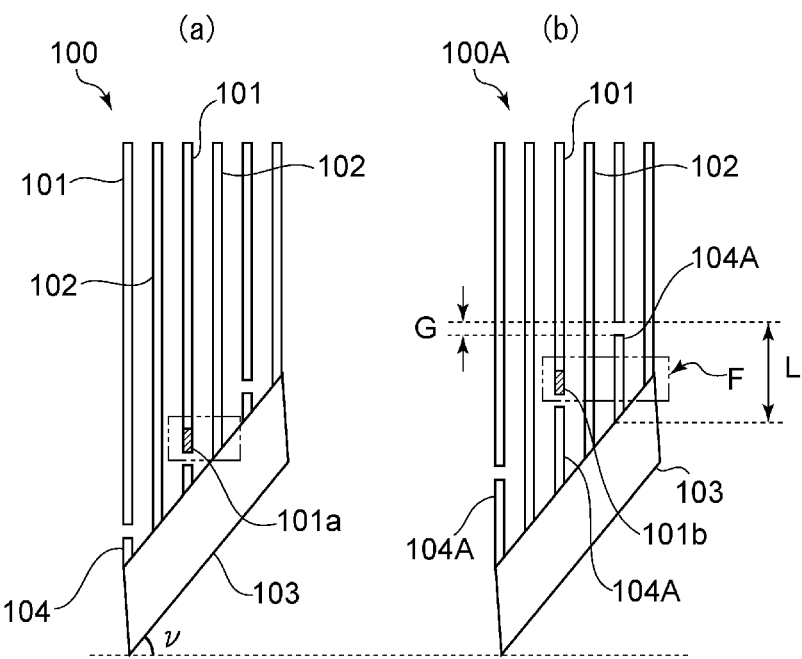
FIG. 27 is a cut-away plan view illustrating the structures of an IDT electrode having a small offset length and an IDT electrode having a large offset length, respectively.

FIG. 27 is a schematic diagram for clarifying the definition of the offset length according to the present invention. FIG. 27 is a partial plan view illustrating the main portion of a single IDT electrode.

Referring to (a) of FIG. 27, an IDT electrode 100 includes a plurality of first electrode fingers 101 and a plurality of second electrode fingers 102 that are alternately arranged. The direction of a line connecting the distal ends of the first electrode fingers 101 extends obliquely with respect to the propagation direction ψ at the oblique angle ν illustrated in the figure.

The surface acoustic wave propagates in a direction orthogonal to the direction in which the electrode fingers 101 and 102 extend. Therefore, when the surface acoustic wave excited in an electrode finger portion 101a indicated by the shaded region in (a) of FIG. 27 propagates rightward, the surface acoustic wave is reflected by the second electrode finger 102 that is immediately adjacent to the electrode finger portion 101a on the right side thereof. Accordingly, there is only one electrode finger 102 that serves as a reflector on the right side of the electrode finger portion 101a.

In contrast, in the region enclosed by the one-dot chain line F in (b) of FIG. 27, when the surface acoustic wave excited by an electrode finger portion 101b propagates rightward, three reflectors are present. More specifically, the second electrode finger 102 that is immediately adjacent to the electrode finger portion 101b, a dummy electrode finger 104A, and the next second electrode finger 102 function as reflectors.

In the IDT electrode 100A illustrated in (b) of FIG. 27, the number of pairs of effective reflectors for the surface acoustic wave is able to be increased.

The reason why the number of pairs of effective reflectors differs is that the length of dummy electrode fingers 104A is longer than the length of dummy electrode fingers 104 in (a) of FIG. 27. Namely, the offset length, which is the distance from the distal ends of the first electrode fingers 101 to a busbar 103, is long. The sum of the length of the dummy electrode fingers 104A and the length of gaps G in the direction in which the electrode fingers extend is defined as the offset length L.

In the above-described structures in which the oblique angle ν is large, the reflection effect increases as the offset length L increases.

Figure 28:
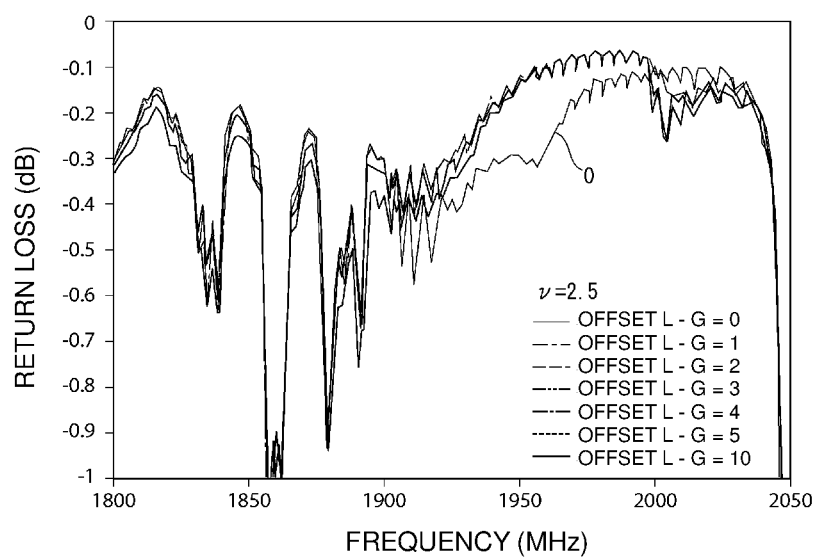
FIG. 28 shows changes in the return loss characteristic in the case where the oblique angle ν is about 2.5° and the amount of offset (L–G) is changed.

In the elastic wave resonator of Example 1 according to the above-described first preferred embodiment, the amount of offset (L−G), which is obtained by subtracting the size of the gaps G from the above-described offset length L, was changed to 0, about 1 μm, about 2 μm, about 3 μm, about 4 μm, about 5 μm, and 10 μm. FIG. 28 shows the return loss characteristics of the thus-manufactured elastic wave resonators.

To confirm the effect of the offset, the relationship between the amount of offset and the difference ΔR.L. in the amount of return loss was determined. Here, ΔR.L. is the difference in the return loss at a frequency position corresponding to about 98.8% of the anti-resonant frequency. This is the frequency position of a shoulder portion of a pass band in the case where a band pass filter is provided. Assuming that the return loss for the amount of offset excluding the gap size is X, when, for example, the amount of offset of about 10 μm, ΔR.L. can be expressed as ΔR.L.=(X−return loss for offset length=10 μm+size of gap G).

Figure 29:
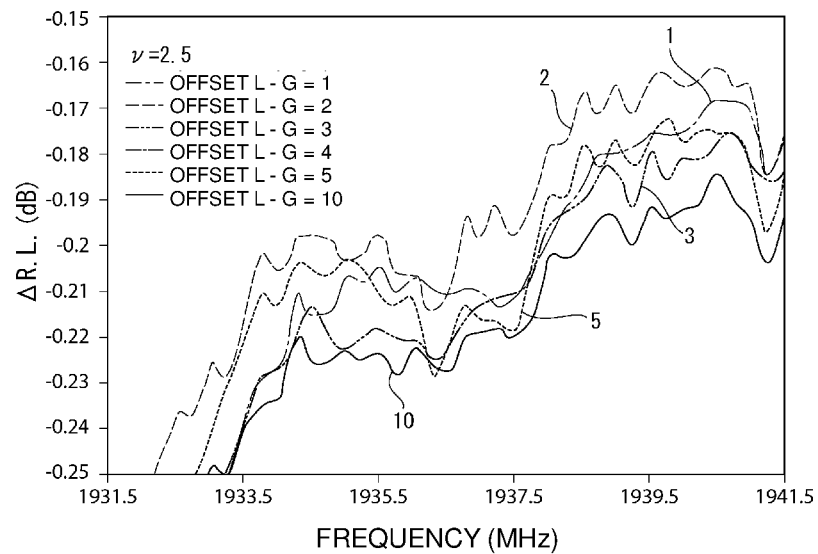
FIG. 29 shows the relationships between the frequency and ΔR.L. determined by the return loss characteristics shown in FIG. 28.

FIG. 29 shows the relationship between the frequency and ΔR.L. determined from FIG. 28. More specifically, FIG. 29 shows changes in ΔR.L. in the cases where the amount of offset (L−G) was changed to about 1 μm, about 2 μm, about 3 μm, about 4 μm, about 5 μm, and about 10 μm as in FIG. 28.

In each case, the oblique angle ν was set to about 2.5°.

Elastic wave resonators were similarly manufactured except that the oblique angle ν was changed to about 5°, about 7.5°, about 10°, and about 15°. FIGS. 30, 32, 34, and 36 show the return loss characteristics of these elastic wave resonators. FIGS. 31, 33, 35, and 37 show changes in ΔR.L. in the case where the offset length was changed as described above.

As is clear from FIGS. 28 and 29, in the case where the oblique angle ν is about 2.5°, ΔR.L. is about 0.01 or more when the amount of offset (L−G) is about 1 μm or more.

Figure 30:
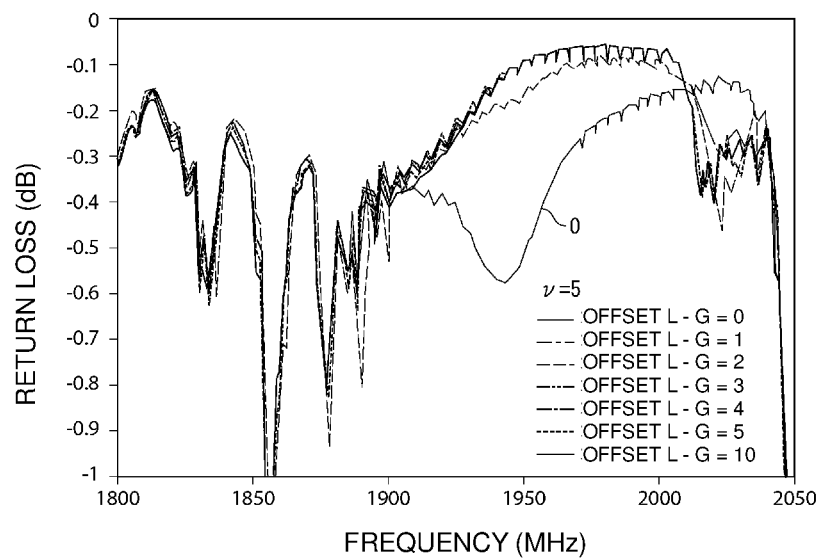
FIG. 30 shows changes in the return loss characteristic in the case where the oblique angle ν is about 5° and the amount of offset (L–G) is changed.
Figure 31:
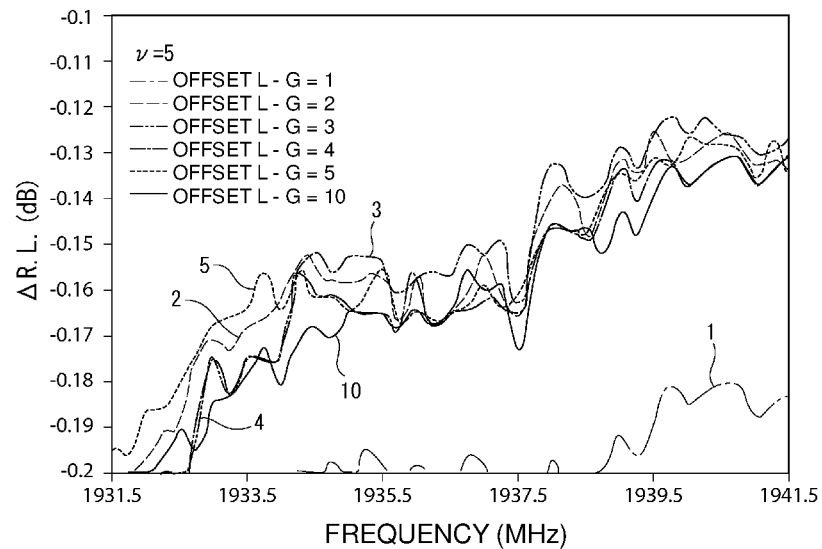
FIG. 31 shows the relationships between the frequency and ΔR.L. determined by the return loss characteristics shown in FIG. 30.

As is clear from FIGS. 30 and 31, in the case where the oblique angle ν is about 5°, ΔR.L. is about 0.01 or more when the amount of offset (L−G) is about 2 μm or more.

When the amount of offset (L−G) is about 1 μm or more, ΔR.L. is about 0.1 or more.

Figure 32:
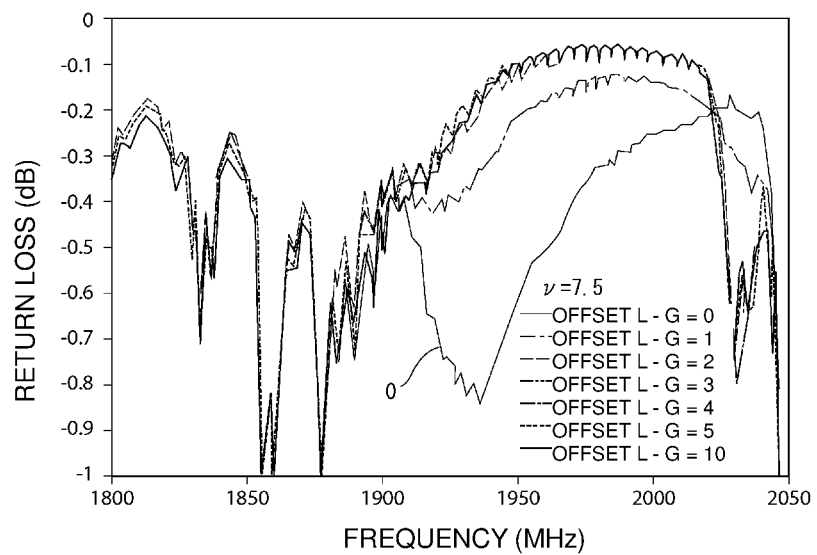
FIG. 32 shows the return loss characteristics of elastic wave devices in which the oblique angle ν is about 7.5° and the amount of offset (L–G) is changed.
Figure 33:
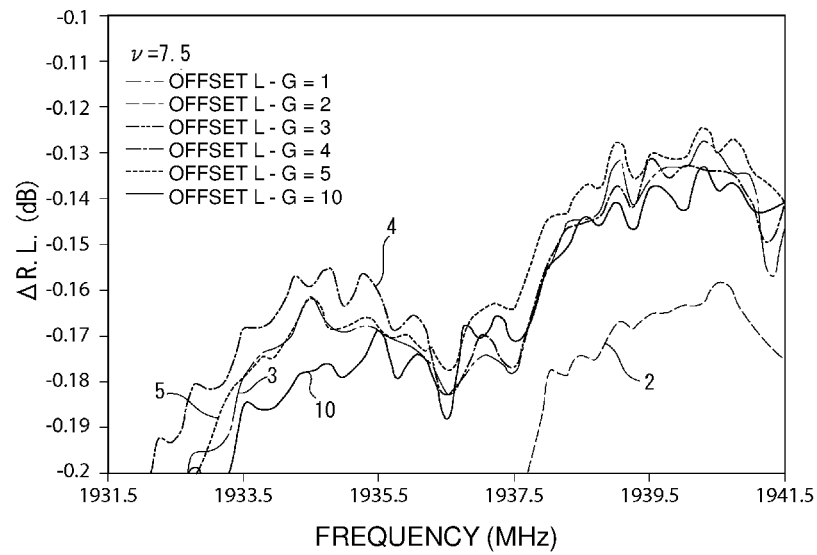
FIG. 33 shows the relationships between the frequency and ΔR.L. determined by the return loss characteristics shown in FIG. 32.

As is clear from FIGS. 32 and 33, in the case where the oblique angle ν is about 7.5°, ΔR.L. is about 0.1 or more when the amount of offset (L−G) is about 2 μm or more, and is 0.01 or more when the amount of offset (L−G) is about 3 μm or more.

Figure 34:
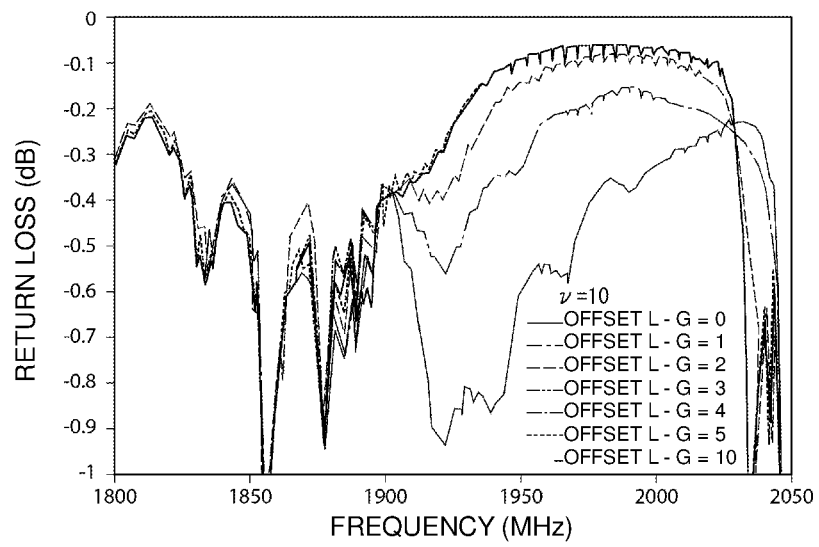
FIG. 34 shows the return loss characteristics of elastic wave devices in which the oblique angle ν is about 10° and the amount of offset (L–G) is changed.
Figure 35:
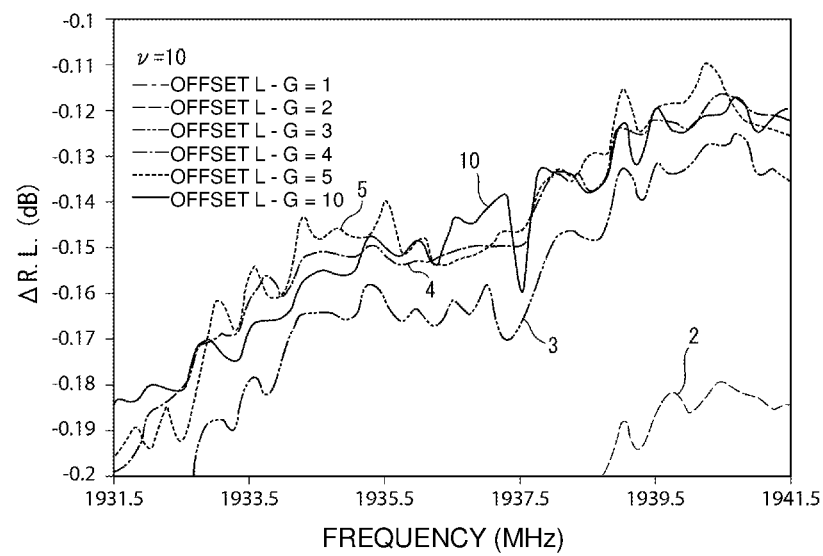
FIG. 35 shows the relationships between the frequency and ΔR.L. determined by the return loss characteristics shown in FIG. 34.

As is clear from FIGS. 34 and 35, in the case where ν is about 10°, ΔR.L. is about 0.1 or more when the amount of offset (L−G) is about 3 μm or more, and is about 0.01 or more when the amount of offset (L−G) is about 4 μm or more. When the amount of offset (L−G) is 5 μm or more, ΔR.L. is about 0.001 or more.

Figure 36:
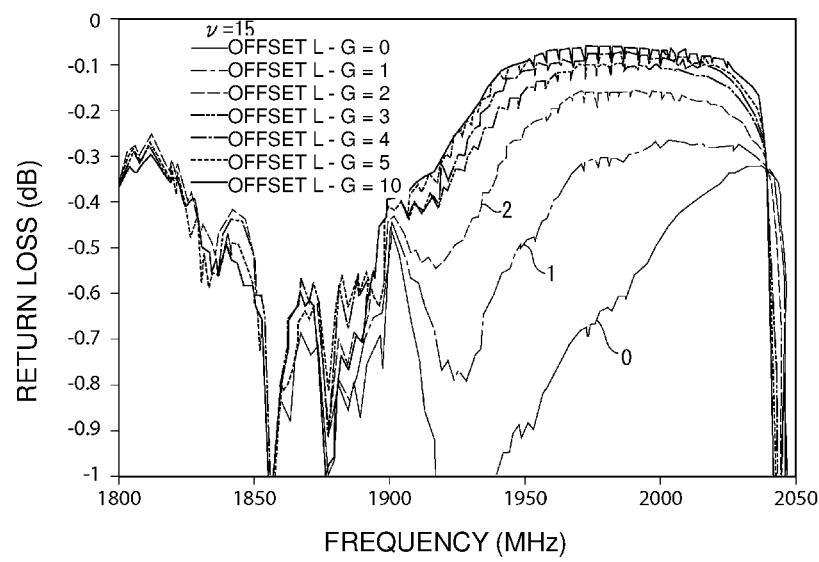
FIG. 36 shows the return loss characteristics of elastic wave devices in which ν=15° and the amount of offset (L–G) is changed.
Figure 37:
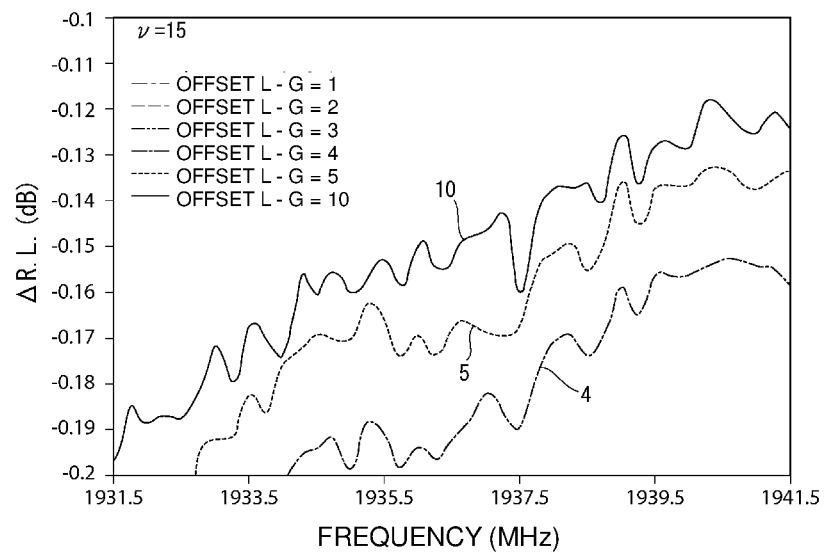
FIG. 37 shows the relationships between the frequency and ΔR.L. determined by the return loss characteristics shown in FIG. 36.

As is clear from FIGS. 36 and 37, in the case where the oblique angle ν is about 15°, ΔR.L. is about 0.1 or more when the amount of offset (L−G) is about 4 μm or more.

The results in FIGS. 28 to 37 show that ΔR.L. may be set to a certain value or more by setting the amount of offset (L−G) to a certain value or more depending on the oblique angle ν.

Figure 38:
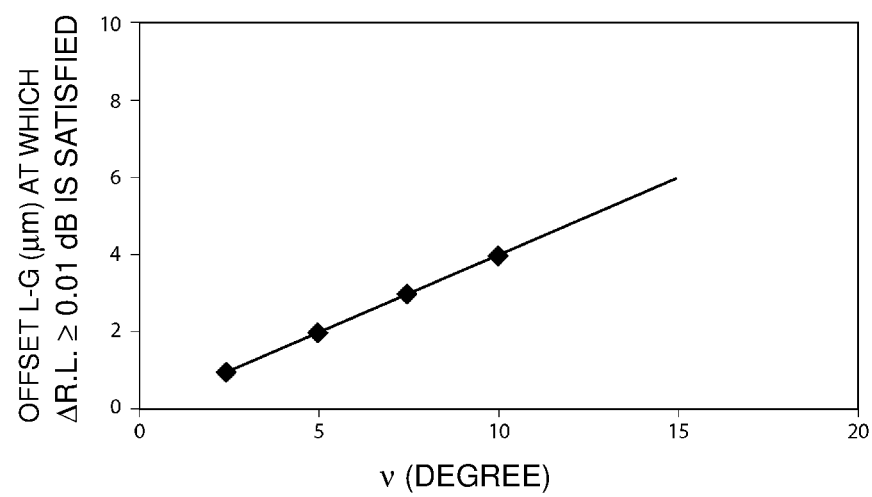
FIG. 38 shows the relationship between the oblique angle ν and the amount of offset (L–G) at which ΔR.L. is about 0.01 dB or more.

The relationship between the amount of offset (L−G) at which the return loss difference ΔR.L. becomes about 0.01 dB or more and the oblique angle ν was determined on the basis of the data of FIGS. 28 to 37. The result of the determination is shown in FIG. 38. As is clear from FIG. 38, when ν is about 5°, the amount of offset (L−G) may be set to about 2 μm or more.

In FIG. 38, the range in which the amount of offset (L−G) is about 5 μm at the oblique angle ν is shown because ΔR.L. is about 0.01 dB or more in this range.

The amount of offset (L−G) can be calculated as (the number of pairs of reflectors−0.5)×λ×tan(ν). Therefore, the above-described offset length L can be expressed as (the number of pairs of reflectors−0.5)×λ×tan(ν)+G.

In the above expression, the number of pairs of reflectors is based on the number of electrode fingers that function as reflectors on the right side of the electrode finger portion 101b, for example, as illustrated in (b) of FIG. 27. In the example illustrated in (b) of FIG. 27, three electrode fingers are present on the right side; therefore, the number of pairs of reflectors is 1.5.

Figure 39:
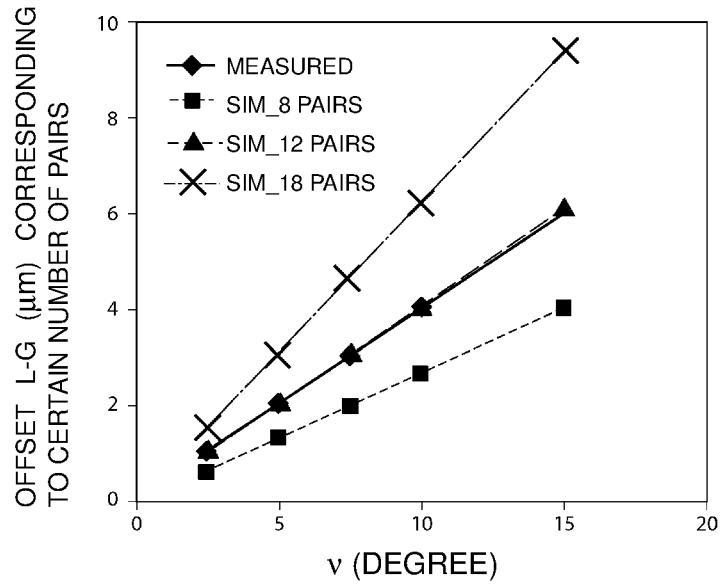
FIG. 39 shows the relationships between the oblique angle ν, the number of pairs of electrode fingers, and the amount of offset (L–G).

In FIG. 39, the horizontal axis represents the above-described ν, and the vertical axis represents the amount of offset (L−G) corresponding to a certain number of pairs. In FIG. 39, the diamonds indicate the same measured values as those in FIG. 38. The rectangles indicate the case in which the number of pairs is 8, the triangles the case in which the number of pairs is 12, and the X marks the case in which the number of pairs is 18. The results for the cases in which the number of pairs is 8, 12, and 18 are the results of simulation for when the number of pairs of reflectors is 8, 12, and 18.

As is clear from FIG. 39, in case where the number of pairs of reflectors is 12, the measured values substantially match the simulation results when ν is in the range of about 2.5° or more and about 10° or less. Therefore, the amount of offset (L−G) may be 11.5×λ×tan(ν) or more, more preferably, 12×λ×tan(ν).

Figure 40:
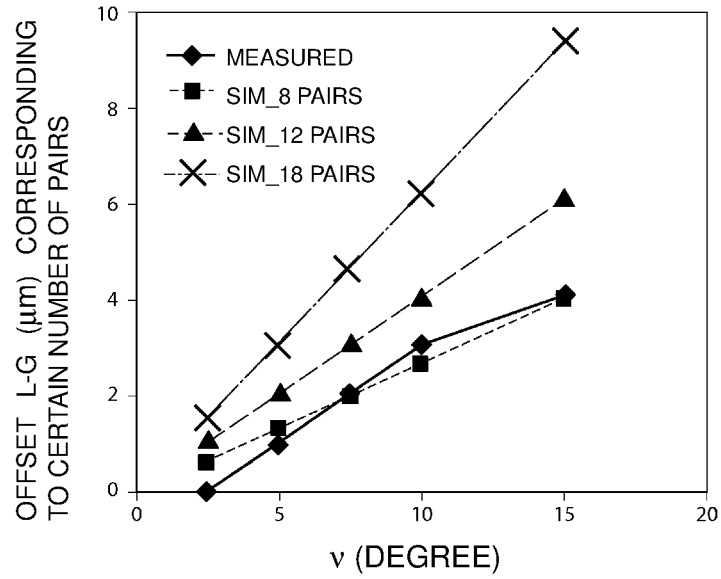
FIG. 40 shows the relationships between the oblique angle ν, the number of pairs of electrode fingers, and the amount of offset (L–G).

FIG. 40 shows the results in the case where ΔR.L. is more than about −0.1 (dB) at the frequency position corresponding to about 98.8% of the anti-resonant frequency. In the case where ΔR.L. is more than about −0.1, the measured values substantially match the simulation results for when the number of pairs is 8 when ν is in the range of about 2.5° or more and about 10° or less. Therefore, the amount of offset (L−G) is preferably 7.5×λ tan(ν) or more, more preferably, 8×λ×tan(ν).

Figure 41:
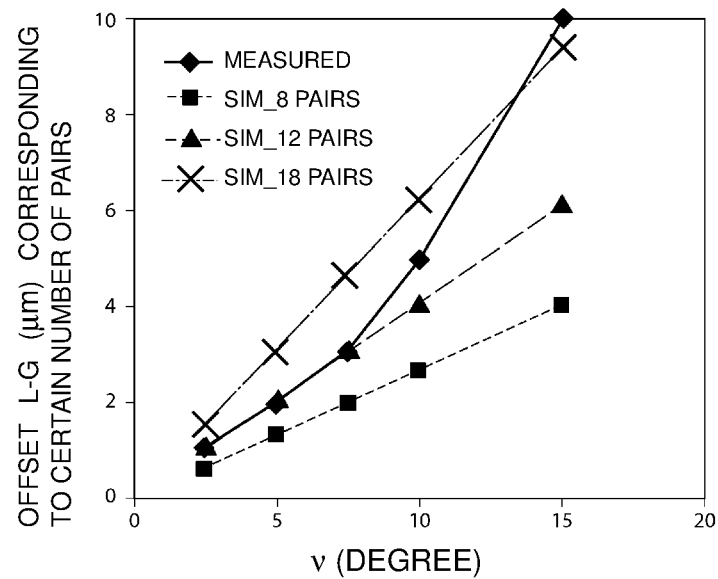
FIG. 41 shows the relationships between the oblique angle ν, the number of pairs of electrode fingers, and the amount of offset (L–G).

FIG. 41 shows the measured values of the return loss reduction effect, that is, the effect of reducing the loss, at about 98.8% of the anti-resonant frequency in the case where ΔR.L. is more than about −0.001.

As is clear from FIG. 41, the measured values in this case match the simulation results for when the number of pairs is 12 when ν is in the range of about 2.5° or more and about 10° or less. When ν is about 15°, the measured value matches the simulation result for when the number of pairs is 18. Therefore, the offset length may be 17.5×λ×tan(ν) or more, more preferably, 18×λ×tan(ν) or more. In such a case, the loss is further reduced.

Figure 42:
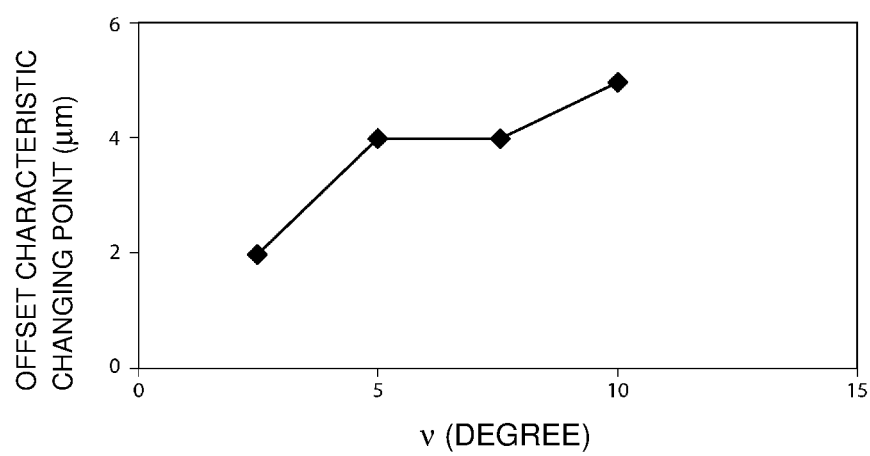
FIG. 42 shows the relationship between the oblique angle ν and the upper limit of the amount of offset at which an appropriate Q value can be obtained.

FIG. 42 shows the relationship between the oblique angle ν and the offset characteristic changing point. When, for example, ν=2.5°, as illustrated in FIGS. 28 and 29, the return loss characteristic changes depending on the offset length. When the characteristic changes depending on the amount of offset (L−G), there is a characteristic-changing point at which the gradient of the characteristic changes by a large amount depending on the amount of offset (L−G). The characteristic-changing point more clearly shows in the frequency characteristic curve of the Q value than in the return loss characteristic. The amount of offset (L−G) at which the Q value-frequency characteristic greatly changes depending on the amount of offset (L−G) is referred to as the offset characteristic-changing point. When the offset length is more than the offset characteristic-changing point, favorable characteristics are obtained.

When the offset length is longer than that corresponding to the value of ν on the line shown in FIG. 42, the Q value is able to be effectively increased.

To confirm changes in characteristics caused by changes in the above-described gap size G, elastic wave resonators having the following design parameters were manufactured as modifications of the sixth preferred embodiment.

Cut angle=60° Y-cut
Overlap width=11λ
Offset length L=2λ
Oblique angle ν=2.5°
Duty=0.7
Al film thickness=0.08λ
LT film thickness=0.2λ
Thickness of $SiO_2$ film below LT=0.35λ
λ=2 μm In these elastic wave resonators, the size of G was set to about 0.2 μm, about 0.3 μm, about 0.4 μm, and about 0.5 μm.

Figure 58:
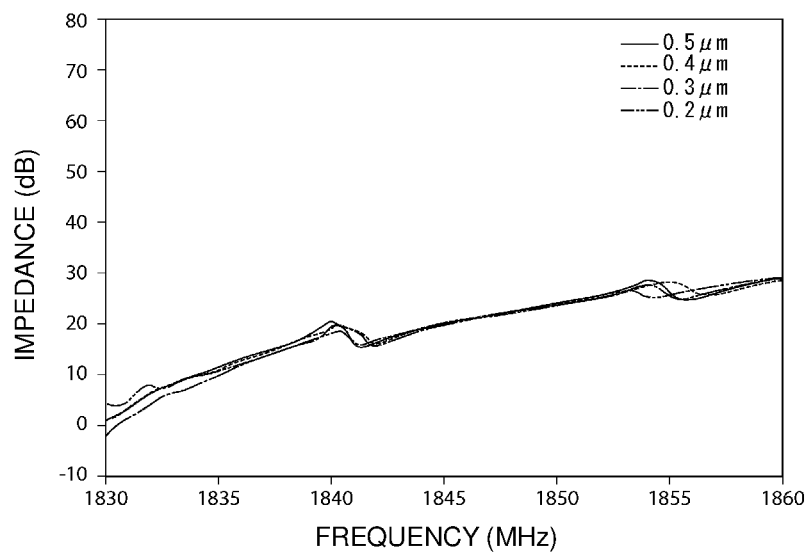
FIG. 58 shows the main portion of the impedance characteristics in the cases where (offset length L−G) is set to about 0.2 μm, about 0.3 μm, about 0.4 μm, and about 0.5 μm in a modification of the sixth preferred embodiment of the present invention.
Figure 59:
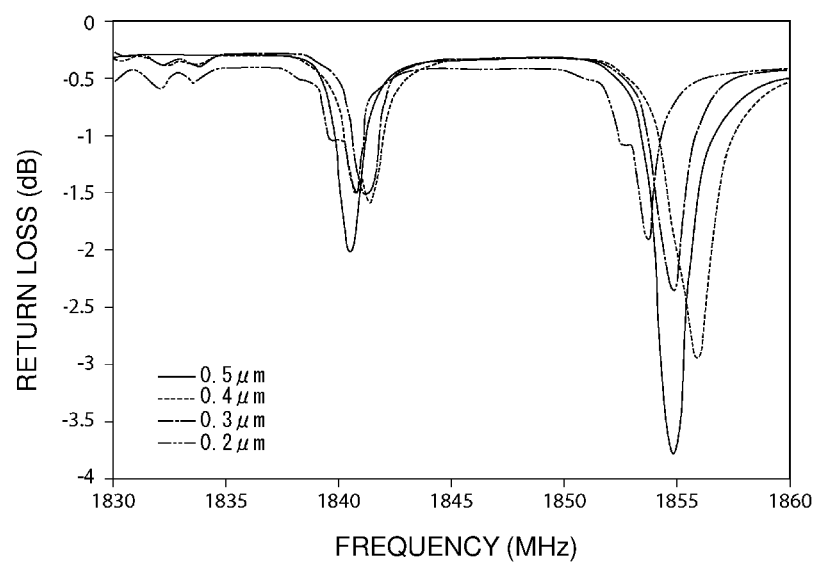
FIG. 59 shows the return loss characteristics in the cases where (offset length L−G) is set to about 0.2 μm, about 0.3 μm, about 0.4 μm, and about 0.5 μm in the modification of the sixth preferred embodiment of the present invention.

FIG. 58 illustrates the main portion of the impedance characteristics of the four types of elastic wave resonators prepared as described above. FIG. 59 shows the return loss characteristics of these elastic wave resonators.

FIG. 58 shows the impedance characteristics in the range around the resonator frequency.

As is clear from FIGS. 58 and 59, when G is smaller than about 0.5 μm, the return loss characteristics are greatly improved. Therefore, G is preferably less than about 0.5 μm, in other words, less than about 0.25λ.

When the gap size G is too small, it is difficult to form the gap. Therefore, to facilitate manufacturing, G is preferably more than about 0.1 μm.

Seventh Preferred Embodiment

Figure 43:
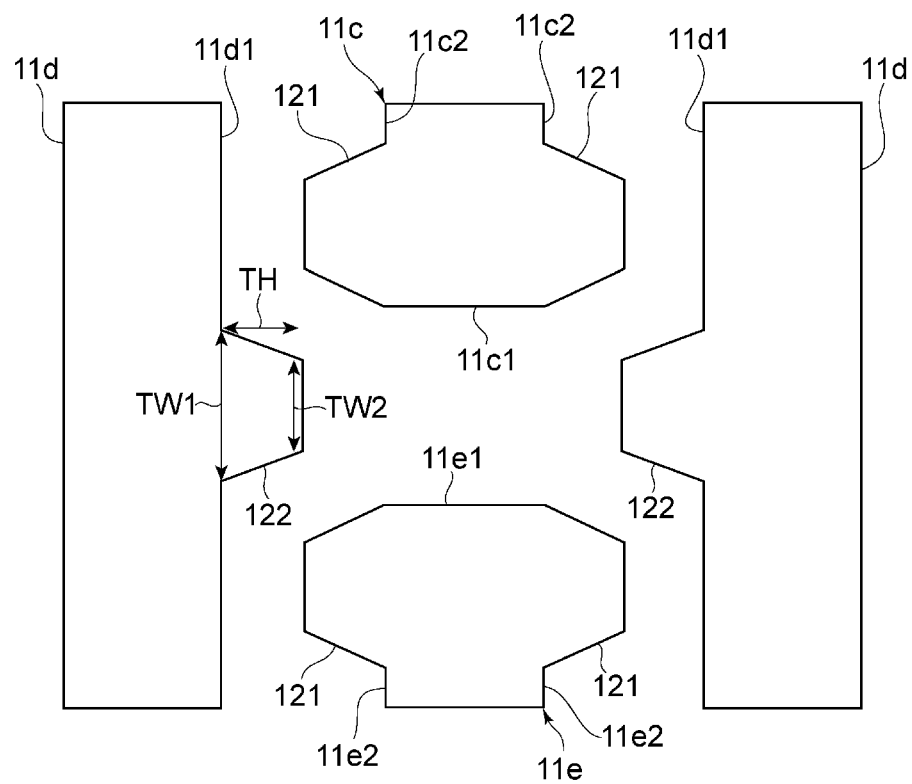
FIG. 43 is a partial plan view illustrating the main portion of an electrode structure of an elastic wave device according to a seventh preferred embodiment of the present invention.

FIG. 43 is a partial plan view illustrating the main portion of an IDT electrode of an elastic wave device according to a seventh preferred embodiment of the present invention. The elastic wave device according to the present preferred embodiment is similar to the elastic wave device 1 according to the first preferred embodiment except that projecting portions 121 and 122 illustrated in FIG. 43 are provided. Therefore, the projecting portions 121 and 122 will be described with regard to other components the description of the first preferred embodiment is to be referred to.

FIG. 43 illustrates a region in which a distal end 11c1 of a first electrode finger 11c and a distal end 11e1 of a first dummy electrode finger 11e face each other with a gap therebetween. Second electrode fingers 11d and 11d are present on the sides of the gap.

The shape of the projecting portions 121 is not particularly limited. In the present preferred embodiment, the projecting portions 121 preferably have a trapezoidal shape, for example.

The projecting portions 121 project from side edges 11c2 and 11c2 of the first electrode finger 11c toward the second electrode fingers 11d. The projecting portions 121 extend to the distal end 11c1 of the first electrode finger 11c.

Similarly, the first dummy electrode finger 11e also have the projecting portions 121 that project from side edges 11e2 and 11e2 thereof toward the second electrode fingers 11d.

The projecting portions 122 are provided on the second electrode fingers 11d. The projecting portions 122 project from side edges 11d1 toward the gap. In the present preferred embodiment, the projecting portions 122 and the projecting portions 121 have the same shape.

FIG. 43 illustrates the gap region in which the first electrode finger 11c and the first dummy electrode finger 11e face each other. Although not illustrated, the projecting portions 121 and 122 are also provided in a gap region in which each second electrode finger 11d and a corresponding second dummy electrode finger 11f face each other.

In the present preferred embodiment, similar to the first preferred embodiment, the IDT electrode 11 has an oblique angle ν of about 2.5° or more. Therefore, similar to the first preferred embodiment, the transverse-mode ripples are reduced. In addition, since the projecting portions 121 and 122 are provided, ripples other than the transverse-mode ripples are also effectively reduced. This will be described with reference to the experiments.

An elastic wave resonator of Example 2 having a structure similar to that of the elastic wave resonator of Example 1 was manufactured. The design parameters were set as follows. That is, a $LiTaO_3$ film whose cut angle is about 60° Y-cut was used as a piezoelectric film. The wavelength λ, which is determined by the pitch of the electrode fingers of the IDT electrode 11, was about 2.0 μm. The overlap width of the electrode fingers was about 15λ. The number of pairs of electrode fingers was 166. The amount of offset was about 2.5 μm. The oblique angle ν was about 2.5°.

Dimensions TH, TW1, and TW2 of the projecting portions 121 and 122 were set as follows.
TH=0.186 μm=0.093λ,
TW1=0.469 μm=0.2345λ, and
TW2=0.117 μm=0.0585λ.

The dimension TH corresponds to the projecting height of the projecting portions 121 and 122. TW1 is the dimension of the bottom side of the trapezoid, which is the dimension of a portion of each projecting portion connected to the side edge of the corresponding electrode finger in the width direction. TW2 is the dimension of the top side of the projecting portions 121 and 122, which is the minimum dimension of the projecting portions 121 and 122 in the width direction.

Figure 44:
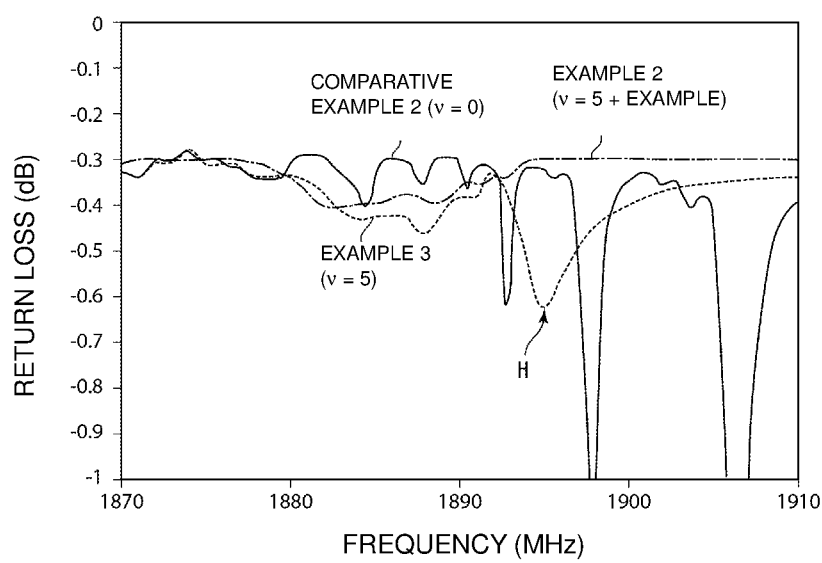
FIG. 44 shows the return loss characteristics of elastic wave resonators according to Comparative Example 2, Example 2, and Example 3.

The elastic wave device of Example 2 was manufactured as an example of an elastic wave device according to the present preferred embodiment. In FIG. 44, the one-dot chain line shows the return loss characteristic of Example 2. For comparison, in FIG. 44, the solid line shows the characteristic of an elastic wave device of Comparative Example 2 in which the oblique angle ν was 0° and no projecting portions were provided. The broken line shows the characteristic of Example 3 in which the oblique angle ν was 5° and the projecting portions 121 and 122 were not provided.

As is clear from FIG. 44, according to Example 2, the transverse-mode ripples are reduced, and the ripple indicated by arrow H can also be reduced. The ripple indicated by arrow H is a ripple other than the transverse-mode ripples.

Thus, according to the present preferred embodiment, not only are the transverse-mode ripples reduced by setting the oblique angle ν in the range of about 1° or more and about 10° or less, other ripples are also effectively reduced.

Figure 45:
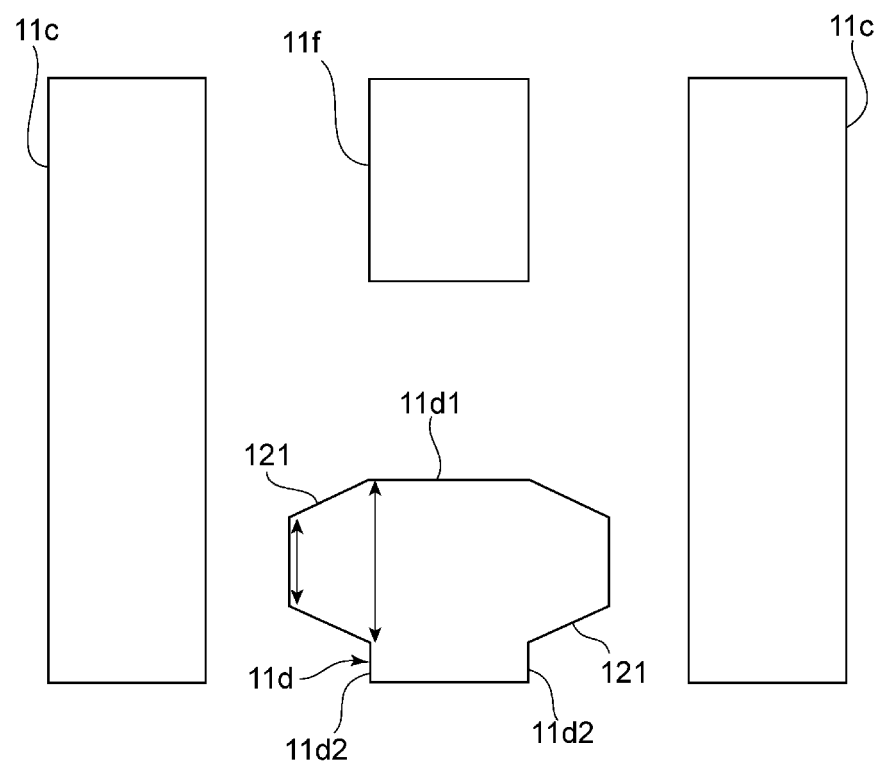
FIG. 45 is a plan view illustrating the main portion of an electrode structure of an elastic wave device according to an eighth preferred embodiment of the present invention.

FIG. 45 is a plan view of the main portion of an IDT electrode of an elastic wave device according to an eighth preferred embodiment of the present invention.

FIG. 45 illustrates a region in which a distal end 11d1 of a second electrode finger 11d and a second dummy electrode finger 11f face each other with a gap therebetween. First electrode fingers 11c and 11c are located on both sides of the gap. In the present preferred embodiment, projecting portions 121 and 121 are provided on side edges 11d2 and 11d2 of the second electrode finger 11d. No projecting portions are provided on the second dummy electrode finger 11*f*. Only the projecting portions 121 and 121 are provided in the region around the gap, and the projecting portions 122 illustrated in FIG. 43 are not provided.

Although not illustrated, in a gap in which each first electrode finger 11*c* and a corresponding first dummy electrode finger 11*e* face each other, the projecting portions 121 and 121 are provided only on the first electrode finger.

As in the present preferred embodiment, the projecting portions 121 may be provided only on the distal ends of each first electrode finger 11*c* and each second electrode finger 11*d* in the gaps.

Figure 46:
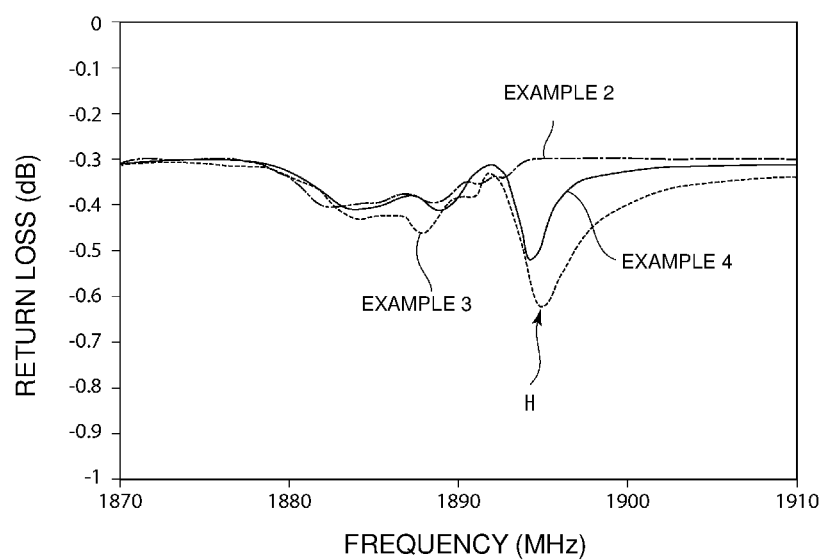
FIG. 46 shows the return loss characteristics of Example 2, Example 3, and Example 4.

An elastic wave device of Example 4 was manufactured similarly to the above-described Example 2 except that the projecting portions 121 were provided as described above. In FIG. 46, the solid line shows the return loss characteristic of this elastic wave device. For comparison, the one-dot chain line shows the characteristic of Example 2 shown in FIG. 44. The broken line in FIG. 46 shows the characteristic of Example 3.

As is clear from FIG. 46, also when the projecting portions 121 were provided only on the distal ends of the first electrode fingers 11*c* and the second electrode fingers 11*d*, the ripple indicated by arrow H is reduced.

Figure 47:
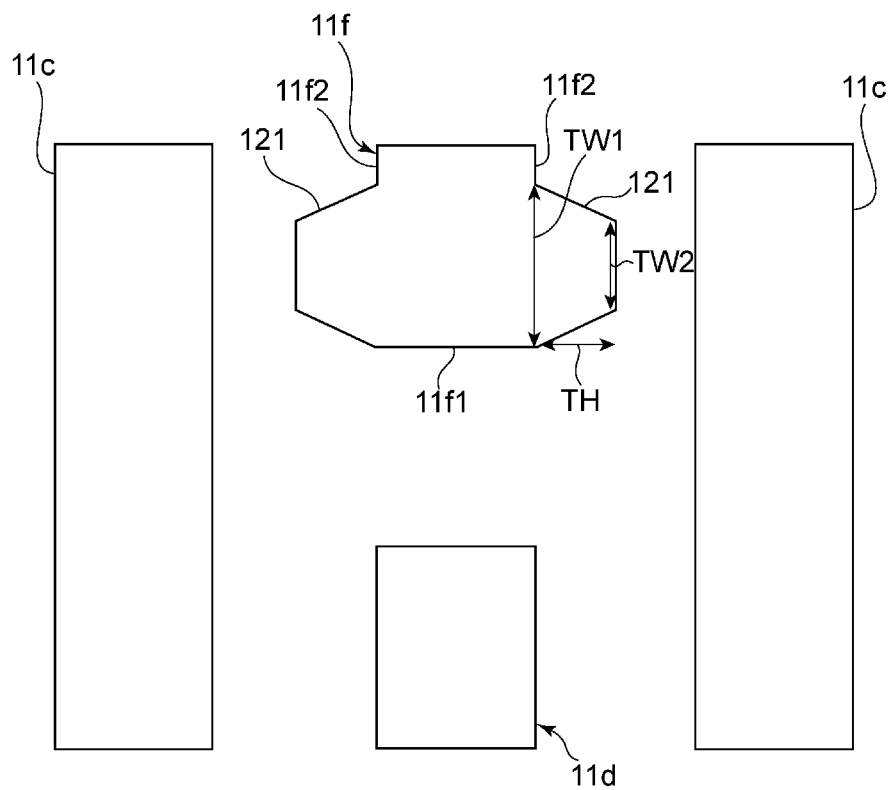
FIG. 47 is a plan view illustrating the main portion of an electrode structure of an elastic wave device according to a ninth preferred embodiment.

FIG. 47 is a partial plan view of the main portion of an IDT electrode according to a ninth preferred embodiment. In the present preferred embodiment, unlike the structure illustrated in FIG. 45, projecting portions 121 and 121 are provided on a second dummy electrode 11*f*. No projecting portions are provided on a second electrode finger 11*d*, which faces the second dummy electrode 11*f* with a gap therebetween. Thus, the projecting portions 121 and 121 may be provided only on the second dummy electrode finger 11*f*, which is close to the busbar. Although not illustrated, also in a gap in which the distal end of each first electrode finger 11*c* faces a corresponding first dummy electrode finger, the projecting portions are provided only on the distal end of the first dummy electrode finger.

Figure 48:
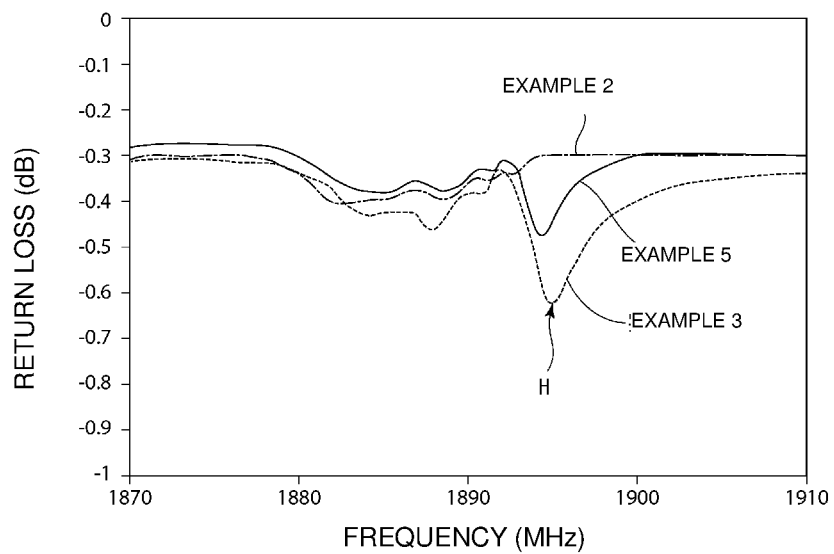
FIG. 48 shows the return loss characteristics of Example 2, Example 3, and Example 5.

An elastic wave device of Example 5 was manufactured similarly to Example 2 except that the projecting portions 121 were provided as described above. In FIG. 48, the solid line shows the return loss characteristic of the elastic wave device of Example 5. For comparison, the one-dot chain line shows the characteristic of Example 2. The broken line shows the characteristic of Example 3 in which no projecting portions were provided. As is clear from FIG. 48, also in the present preferred embodiment, the ripple indicated by arrow H is effectively reduced.

Figure 49:
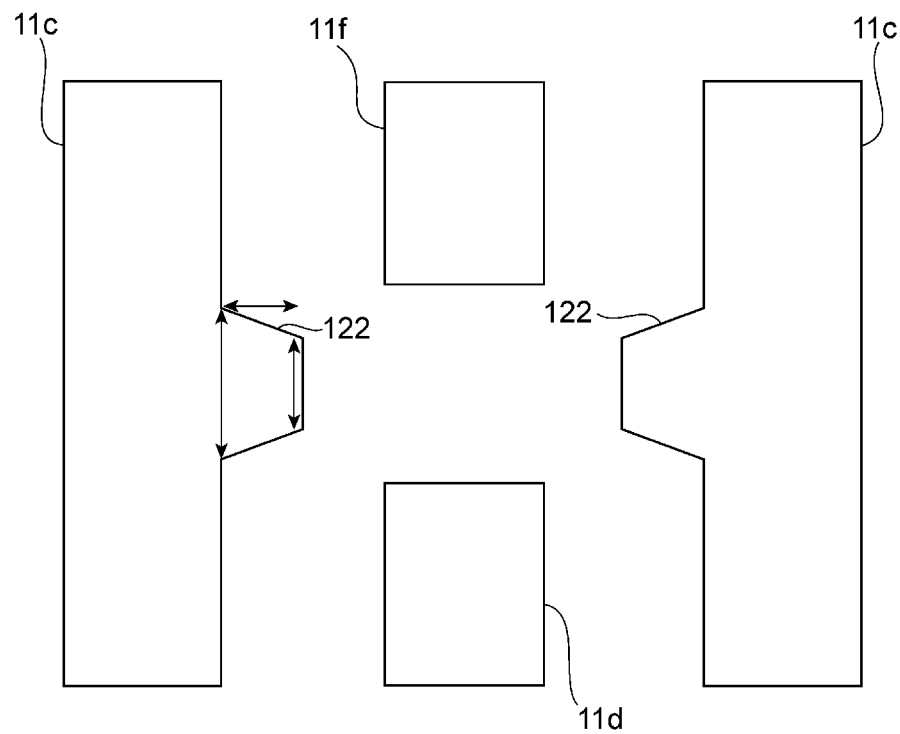
FIG. 49 is a plan view illustrating the main portion of an electrode structure of an elastic wave device according to a tenth preferred embodiment of the present invention.

FIG. 49 is a partial plan view illustrating the main portion of an IDT electrode of an elastic wave device according to a tenth preferred embodiment. In the present preferred embodiment, the projecting portions 121 are not provided in the gap in which the distal end of a second dummy electrode finger 11*f* and the distal end of a second electrode finger 11*d* face each other. Projecting portions 122 are provided on first electrode fingers 11*c*. The projecting portions 122 are the only portions that project toward the gap.

Although not illustrated, in a gap in which the distal end of each first electrode finger 11*c* and the distal end of a corresponding first dummy electrode finger face each other, the projecting portions 122 project from the side edges of second electrode fingers 11*d* in a similar manner.

Figure 50:
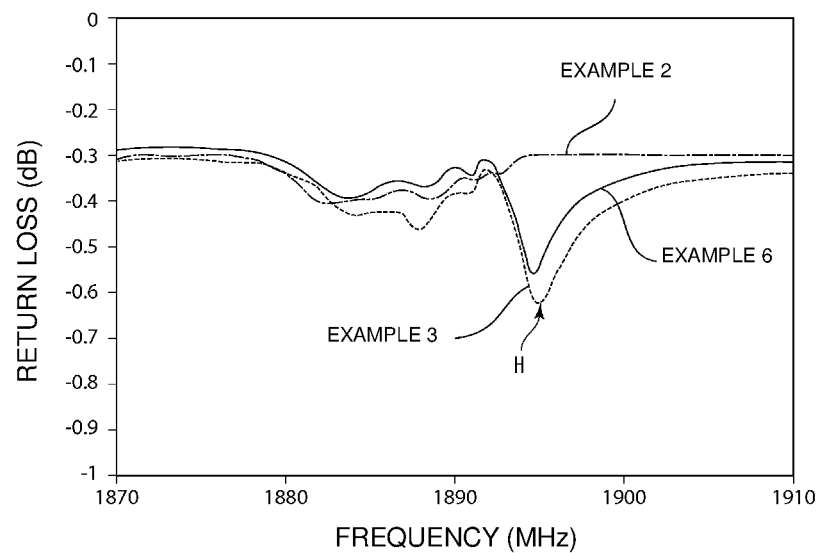
FIG. 50 shows the return loss characteristics of Example 2, Example 3, and Example 6.

As an example of the present preferred embodiment, an elastic wave device of Example 6 was manufactured similarly to Example 2 except that only the projecting portions 122 were provided. In FIG. 50, the solid line shows the return loss characteristic of the elastic wave device of Example 6. The one-dot chain line in FIG. 50 shows the characteristic of Example 2. The broken line in FIG. 50 shows the characteristic of Example 3 in which no projecting portions were provided.

As is clear from FIG. 50, also when only the projecting portions 122 that project toward the gap from the sides of the gap are provided, the ripple indicated by arrow H is reduced.

Examples 7 to 9, in which the dimensions TH, TW1 and TW2 of the projecting portions 121 and 122 in Example 2 illustrated in FIG. 44 were changed as in Table 1 below, were manufactured.

TABLE 1

| Unit is μm | TH | TW1 | TW2 |
|---|---|---|---|
| Example 7 | 0.0932 | 0.2347 | 0.0583 |
| Example 8 | 0.1865 | 0.2347 | 0.0583 |
| Example 9 | 0.2797 | 0.2347 | 0.0583 |

Figure 51:
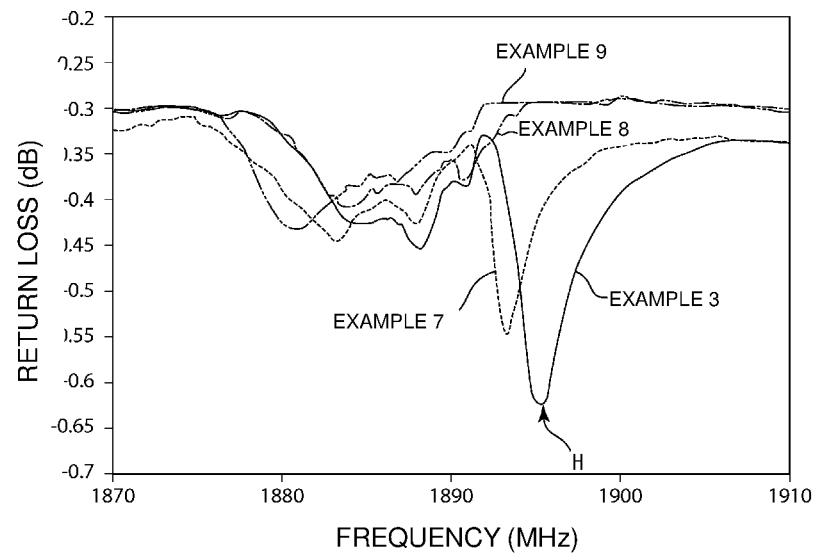
FIG. 51 shows changes in the return loss characteristic in the case where a dimension TH of projecting portions is changed.

FIG. 51 shows the return loss characteristics of the above-described Examples 7 to 9 and Example 3 in which no projecting portions were provided.

FIG. 51 shows that, when TH is about 0.0932 μm or more, that is, about 0.0466λ or more, the ripple indicated by arrow H is more effectively reduced.

Examples 10 to 12, in which the dimensions TH, TW1 and TW2 of the projecting portions 121 and 122 in Example 2 were changed as in Table 2 below, were manufactured.

TABLE 2

| Unit is μm | TH | TW1 | TW2 |
|---|---|---|---|
| Example 10 | 0.0932 | 0.2347 | 0.0583 |
| Example 11 | 0.0932 | 0.4694 | 0.0583 |
| Example 12 | 0.0932 | 0.7041 | 0.0583 |

Figure 52:
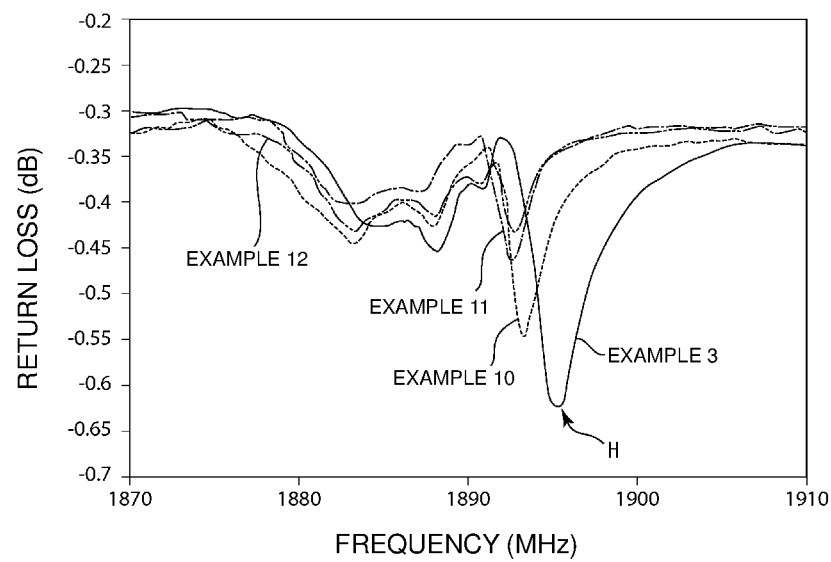
FIG. 52 shows changes in the return loss characteristic in the case where a dimension TW1 of the projecting portions is changed.

FIG. 52 shows the return loss characteristics of Examples 10 to 12. For comparison, the solid line in FIG. 52 shows the return loss characteristic of Example 3 in which no projecting portions were provided.

As is clear from FIG. 52, when TW1 is about 0.2347 μm or more, that is, about 0.11735λ or more, the ripple indicated by arrow H is more effectively reduced.

Elastic wave devices of Examples 13 to 15, in which TH, TW1 and TW2 in Example 2 were changed as in Table 3 below, were manufactured.

TABLE 3

| Unit is μm | TH | TW1 | TW2 |
|---|---|---|---|
| Example 13 | 0.0932 | 0.2347 | 0.0583 |
| Example 14 | 0.0932 | 0.2347 | 0.1166 |
| Example 15 | 0.0932 | 0.2347 | 0.1748 |

Figure 53:
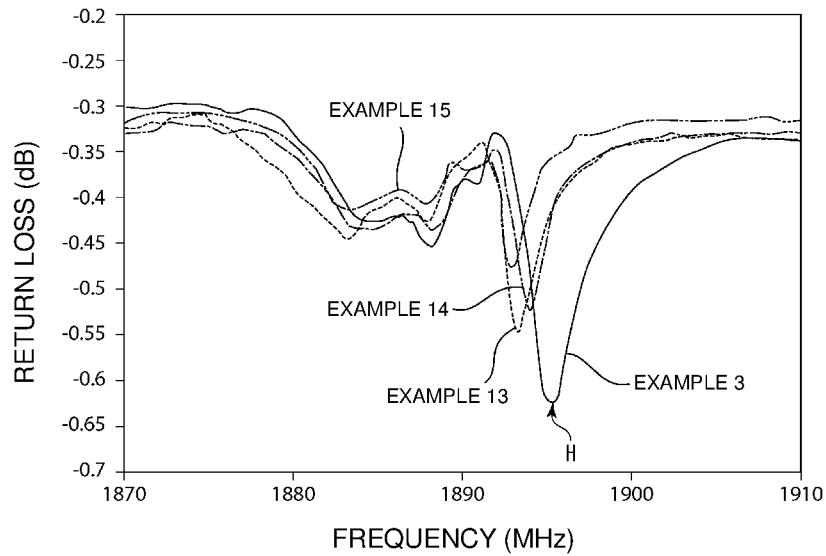
FIG. 53 shows changes in the return loss characteristic in the case where a dimension TW2 of the projecting portions is changed.

FIG. 53 shows the return loss characteristics of Examples 13 to 15 manufactured as described above. For comparison, in FIG. 53, the solid line shows the characteristic of Example 3 in which no projecting portions were provided.

As is clear from FIG. 53, when TW2 is about 0.0583 μm or more, that is, about 0.02915λ or more, the ripple indicated by arrow H is more effectively reduced.

Elastic wave devices were manufactured similarly to Example 2 except that the film thickness of the IDT electrode made of Al was changed. In the present preferred embodiment, the oblique angle v was set to about 7.5°.

Figure 54:
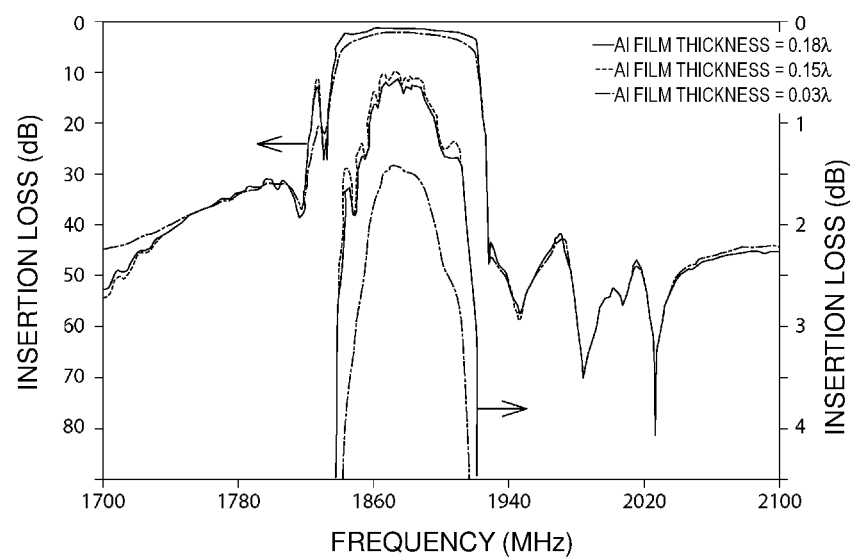
FIG. 54 shows the attenuation frequency characteristics in the cases where the film thickness of IDT electrodes made of Al are about 0.03λ, about 0.15λ, and about 0.18λ.

FIG. 54 shows the attenuation frequency characteristics of the elastic wave devices in which the thickness of the Al film was about 0.03λ, about 0.15λ, and about 0.18λ.

As is clear from FIG. 54, when the thickness of the Al film is about 0.03λ, the shoulder portions of the pass band are rounded. This shows that, when the thickness of the Al film is increased, the insertion loss is sufficiently reduced over the entire pass band. This is probably because the electrical resistance decreases as the thickness of the Al film increases.

Figure 55:
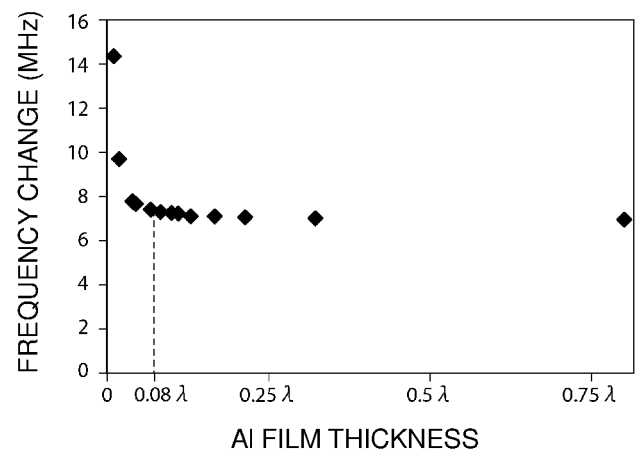
FIG. 55 shows the relationship between the film thickness of the Al films that constitute the IDT electrodes and the amount of frequency variation.

FIG. 55 shows changes in the frequency difference at the shoulder portions of the pass band in the case where the thickness of the Al film is changed. The frequency difference is the difference between the frequency position at which the attenuation is about 3.5 dB and the frequency at which the attenuation is about 40 dB. As the frequency difference decreases, the steepness of the shoulder portions increases. The results are shown in FIG. 55. As is clear from FIG. 55, when the thickness of the Al film is less than about 0.08λ, the frequency difference significantly increases as the thickness of the Al film decreases. In contrast, when the Al film thickness is about 0.08λ or more, the frequency difference is substantially constant and small. Therefore, the thickness of the Al film is preferably about 0.08λ or more.

Figure 56:
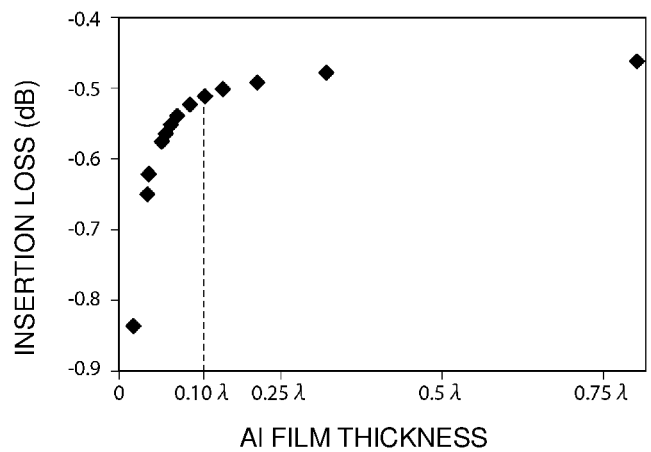
FIG. 56 shows the relationship between the film thickness of the Al films that constitute the IDT electrodes and the maximum insertion loss in the band.

FIG. 56 shows the relationship between the thickness of the Al film and the insertion loss. Here, the insertion loss is the minimum insertion loss that is smallest in the pass band.

As is clear from FIG. 56, when the thickness of the Al film is about 0.10λ or more, the insertion loss is sufficiently small and the change in the insertion loss caused by the change in the thickness of the Al film is small. Therefore, more preferably, the thickness of the Al film is about 0.10λ or more. When the Al film is excessively thick, it becomes difficult to manufacture the Al film. Therefore, the thickness is preferably about 400 nm or less.

Although surface acoustic wave resonators, duplexers including surface acoustic wave resonators, and the like are described in the above preferred embodiments and examples, preferred embodiments of the present invention may also be applied to elastic wave devices using boundary acoustic waves.

Figure 57:
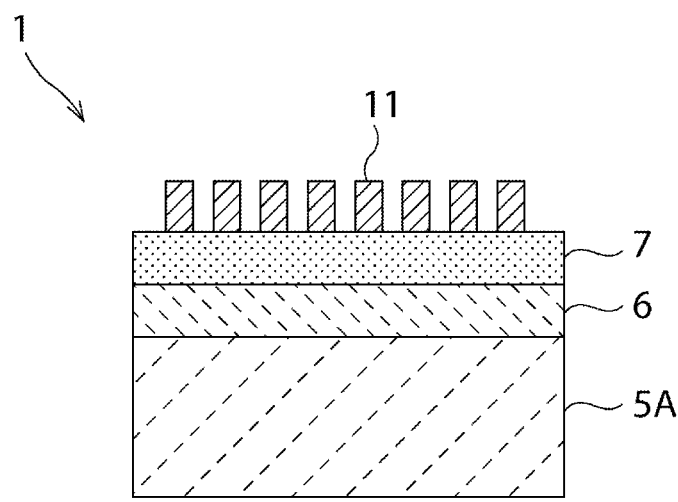
FIG. 57 is a front sectional view of a modification of an elastic wave device according to a preferred embodiment of the present invention.

In the preferred embodiment illustrated in FIG. 2, the bonding material layers 3 and 4 and the high acoustic velocity film 5 preferably are stacked on the support substrate 2. However, as in a modification illustrated in FIG. 57, a high acoustic velocity support substrate 5A may instead be used. A low acoustic velocity film 6 and a piezoelectric thin film 7 are stacked on the high acoustic velocity support substrate 5A.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric film made of $LiTaO_3$; and
   an IDT electrode located on one surface of the piezoelectric film; wherein
   the IDT electrode includes a plurality of first electrode fingers and a plurality of second electrode fingers that are alternately arranged;
   a thickness of the piezoelectric film is about 10λ or less when λ is a wavelength determined by a pitch of the electrode fingers of the IDT electrode; and
   a direction of a line connecting distal ends of the plurality of first electrode fingers and a direction of a line connecting distal ends of the second electrode fingers are at an oblique angle ν with respect to a propagation direction ψ of an elastic wave excited by the IDT electrode, the propagation direction ψ being determined by Euler angles (φ, θ, ψ) of the $LiTaO_3$, and the oblique angle ν is in a range of about 0.4° or more and about 15° or less.

2. An elastic wave device comprising:
   a piezoelectric film made of $LiTaO_3$;
   a support substrate;
   a high acoustic velocity film that is located on the support substrate and in which an acoustic velocity of a bulk wave that propagates through the high acoustic velocity film is higher than an acoustic velocity of an elastic wave that propagates through the piezoelectric film;
   a low acoustic velocity film that is stacked on the high acoustic velocity film and in which an acoustic velocity of a bulk wave that propagates through the low acoustic velocity film is lower than an acoustic velocity of a bulk wave that propagates through the piezoelectric film; and
   an IDT electrode located on one surface of the piezoelectric film; wherein
   the piezoelectric film is stacked on the low acoustic velocity film;
   the IDT electrode includes a plurality of first electrode fingers and a plurality of second electrode fingers that are alternately arranged;
   a thickness of the piezoelectric film is about 10λ or less when λ is a wavelength determined by a pitch of the electrode fingers of the IDT electrode; and
   a direction of a line connecting distal ends of the plurality of first electrode fingers and a direction of a line connecting distal ends of the second electrode fingers are at an oblique angle ν with respect to a propagation direction ψ of an elastic wave excited by the IDT electrode, the propagation direction ψ being determined by Euler angles (φ, θ, ψ) of the $LiTaO_3$, and the oblique angle ν is in a range of about 0.4° or more and about 15° or less.

3. An elastic wave device comprising:
   a piezoelectric film made of $LiTaO_3$;
   a high acoustic velocity support substrate in which an acoustic velocity of a bulk wave that propagates through the high acoustic velocity support substrate is higher than an acoustic velocity of an elastic wave that propagates through the piezoelectric film;
   a low acoustic velocity film that is stacked on the high acoustic velocity support substrate and in which an acoustic velocity of a bulk wave that propagates through the low acoustic velocity film is lower than an acoustic velocity of a bulk wave that propagates through the piezoelectric film; and
   an IDT electrode located on one surface of the piezoelectric film; wherein
   the piezoelectric film is stacked on the low acoustic velocity film;
   the IDT electrode includes a plurality of first electrode fingers and a plurality of second electrode fingers that are alternately arranged;
   a thickness of the piezoelectric film is about 10λ or less when λ is a wavelength determined by a pitch of the electrode fingers of the IDT electrode; and
   a direction of a line connecting distal ends of the plurality of first electrode fingers and a direction of a line connecting distal ends of the second electrode fingers are at an oblique angle ν with respect to a propagation direction ψ of an elastic wave excited by the IDT electrode, the propagation direction ψ being determined by Euler angles (φ, θ, ψ) of the LiTaO$_3$, and the oblique angle ν is in a range of about 0.4° or more and about 15° or less.

4. The elastic wave device according to claim 1, wherein the oblique angle ν is about 10° or less.

5. The elastic wave device according to claim 1, wherein a thickness of the piezoelectric film made of LiTaO$_3$ is more than about 0.2λ when λ is the wavelength determined by the pitch of the electrode fingers of the IDT electrode.

6. The elastic wave device according to claim 1, wherein a cut angle of the LiTaO$_3$ is about 30° or more and about 60° or less.

7. The elastic wave device according to claim 1, wherein a duty of the IDT electrode is less than about 0.7, and a dimension of the electrode fingers of the IDT electrode in a width direction is about 0.15 μm or more.

8. The elastic wave device according to claim 1, wherein
first dummy electrode fingers oppose the distal ends of the first electrode fingers of the IDT electrode with gaps therebetween, and second dummy electrode fingers oppose the distal ends of the second electrode fingers of the IDT electrode with gaps therebetween, the first dummy electrode fingers being connected to a second busbar, the second dummy electrode fingers being connected to a first busbar; and
when a distance from the distal ends of the first and second electrode fingers to proximal ends of the second and first dummy electrode fingers is an offset length L, and a size of the gaps in a direction in which the electrode fingers extend is G, (L−G)≥7.5×λ×tan(ν) is satisfied.

9. The elastic wave device according to claim 8, wherein (the offset length L−G)≥11.5×λ×tan(ν) is satisfied.

10. The elastic wave device according to claim 9, wherein (the offset length L−G)≥17.5×λ×tan(ν) is satisfied.

11. The elastic wave device according to claim 8, wherein the size G of the gaps is more than about 0.1 μm and less than about 0.5 μm.

12. The elastic wave device according to claim 8, wherein either or both of the first electrode fingers and the second electrode fingers of the IDT electrode are provided with projecting portions that project outward in a width direction of the electrode fingers from side edges that extend in a direction in which the electrode fingers extend.

13. The elastic wave device according to claim 12, wherein the projecting portions are provided on side edge portions of the either or both of the first and second electrode fingers, the side edge portions being continuous to the distal ends of the either or both of the first and second electrode fingers.

14. The elastic wave device according to claim 12, wherein either or both of the first and second dummy electrode fingers are provided with the projecting portions.

15. The elastic wave device according to claim 12, wherein the projecting portions are provided on the side edges of the electrode fingers that do not extend to the distal ends of the first and second electrode fingers.

16. The elastic wave device according to claim 12, wherein the projecting portions have a trapezoidal shape in plan view, and when a length of a bottom side of the trapezoidal shape that is continuous to the corresponding side edge is TW1, and TW1≥0.11735λ is satisfied.

17. The elastic wave device according to claim 16, wherein, when a minimum dimension of the projecting portions in a direction along the side edges of the electrode fingers is TW2, and TW2≥0.02915λ is satisfied.

18. The elastic wave device according to claim 16, wherein a dimension of the projecting portions in the propagation direction of the elastic wave is TH, and TH≥0.0466λ is satisfied.

19. The elastic wave device according to claim 1, wherein the IDT electrode is made of Al or an alloy containing Al as a main component, and a film thickness of the IDT electrode is in a range of about 0.08λ or more and about 0.097λ or less.

20. The elastic wave device according to claim 1, wherein a film thickness of the IDT electrode is about 0.10λ or more.

21. A filter device comprising at least one or more elastic wave devices, each of the at least one or more elastic wave devices being the elastic wave device according to claim 1.

22. A filter device comprising a plurality of ±ν elastic wave devices, each of the plurality of ±ν elastic wave devices being the elastic wave device according to claim 1.

23. A filter device comprising a plurality of elastic wave devices, each being the elastic wave device according to claim 1.

24. The elastic wave device according to claim 1, wherein a film thickness of the IDT electrode is about 400 nm or less.

* * * * *